(12) United States Patent
Kim et al.

(10) Patent No.: US 12,079,427 B2
(45) Date of Patent: Sep. 3, 2024

(54) INPUT TOUCH DEVICE THAT DETECTS THE AMOUNT OF NEGATIVE CAPACITANCE CHANGE DUE TO COUPLING BETWEEN AN OBJECT AND A PREDETERMINED DRIVING ELECTRODE

(71) Applicant: HiDeep Inc., Seongnam-si (KR)

(72) Inventors: Bonkee Kim, Seongnam-si (KR); Seyeob Kim, Seongnam-si (KR); Jongsik Kim, Seongnam-si (KR); Sein Lee, Seongnam-si (KR)

(73) Assignee: HiDeep Inc. (KR)

( * ) Notice: Subject to any disclaimer, the term of this patent is extended or adjusted under 35 U.S.C. 154(b) by 12 days.

(21) Appl. No.: 17/600,465

(22) PCT Filed: Feb. 11, 2020

(86) PCT No.: PCT/KR2020/001925
§ 371 (c)(1),
(2) Date: Apr. 25, 2022

(87) PCT Pub. No.: WO2020/204345
PCT Pub. Date: Oct. 8, 2020

(65) Prior Publication Data
US 2022/0253173 A1 Aug. 11, 2022

(30) Foreign Application Priority Data
Apr. 2, 2019 (KR) ........................ 10-2019-0038292

(51) Int. Cl.
G06F 3/041 (2006.01)
G06F 3/044 (2006.01)
H10K 59/40 (2023.01)

(52) U.S. Cl.
CPC .......... *G06F 3/0418* (2013.01); *G06F 3/0446* (2019.05); *G06F 3/0447* (2019.05); *H10K 59/40* (2023.02); *G06F 2203/04112* (2013.01)

(58) Field of Classification Search
None
See application file for complete search history.

(56) References Cited

U.S. PATENT DOCUMENTS

2008/0158172 A1* 7/2008 Hotelling ............ G06F 3/04166
345/173
2009/0160787 A1* 6/2009 Westerman ........... G06F 3/0446
345/173
(Continued)

FOREIGN PATENT DOCUMENTS

KR 20110037579 A 4/2011
KR 20110053271 A 5/2011
(Continued)

OTHER PUBLICATIONS

International Search Report from PCT/KR2020/001925, dated Jun. 19, 2020, pp. 1-4, including English translation.
Korean Office Action 10-2023-0049030 Issued on May 24, 2023.

*Primary Examiner* — Kirk W Hermann
(74) *Attorney, Agent, or Firm* — The Belles Group, P.C.

(57) ABSTRACT

An input device including a touch sensor, which is capable of accurately detecting whether a touch input to a touch surface is input by an object or/and a touch position even in a situation where the touch input device is in a floating state. The touch input device includes a touch surface, including: a touch sensor which is disposed under the touch surface and includes a plurality of driving electrodes, a plurality of receiving electrodes, and a plurality of dummy receiving electrodes; and a touch detection unit configured to detect a touch position of an object input to the touch surface based on a detection signal output from the plurality of receiving (Continued)

electrodes of the touch sensor, in which the touch detection unit detects the touch position of the object input to the touch surface.

16 Claims, 30 Drawing Sheets

(56) References Cited

U.S. PATENT DOCUMENTS

| | | | |
|---|---|---|---|
| 2010/0079401 A1* | 4/2010 | Staton | G06F 3/0446 345/173 |
| 2011/0006832 A1 | 1/2011 | Land et al. | |
| 2011/0080353 A1* | 4/2011 | Kang | G06F 3/0446 174/250 |
| 2011/0175823 A1 | 7/2011 | Vieta | |
| 2011/0187663 A1* | 8/2011 | Lin | G06F 3/04166 345/173 |
| 2011/0216033 A1* | 9/2011 | Mamba | G06F 3/04184 345/174 |
| 2012/0092577 A1 | 4/2012 | Shi et al. | |
| 2013/0069905 A1* | 3/2013 | Krah | G06F 3/04182 345/174 |
| 2015/0002443 A1* | 1/2015 | Brunet | G06F 3/0445 345/174 |
| 2016/0179283 A1 | 6/2016 | Hoch | |
| 2016/0313845 A1* | 10/2016 | Lin | G06F 3/044 |
| 2018/0321793 A1* | 11/2018 | Kim | G06F 3/0418 |
| 2018/0329576 A1 | 11/2018 | Kim et al. | |

FOREIGN PATENT DOCUMENTS

| | | | |
|---|---|---|---|
| KR | 20110061637 A | | 6/2011 |
| KR | 1020110061637 A | | 6/2011 |
| KR | 20110099625 A | | 9/2011 |
| KR | 1020110099625 A | | 9/2011 |
| KR | 20120037461 A | | 4/2012 |
| KR | 1020120037461 A | | 4/2012 |
| KR | 20150031767 A | * | 3/2015 |
| KR | 20180122761 A | | 11/2018 |
| KR | 1020180122761 A | | 11/2018 |
| KR | 1020180125671 A | | 11/2018 |

* cited by examiner

[Figure 1]
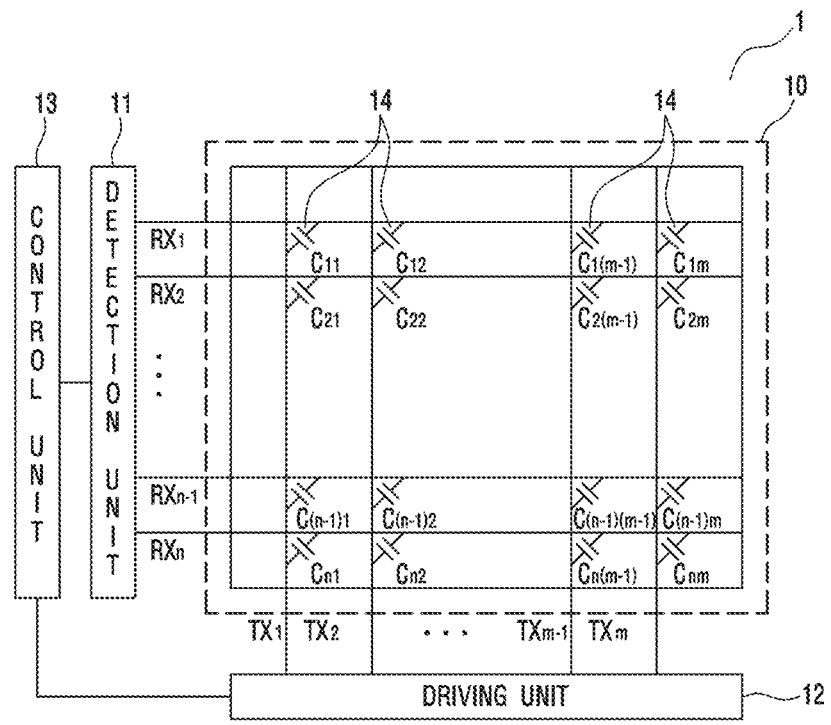
[Figure 2]
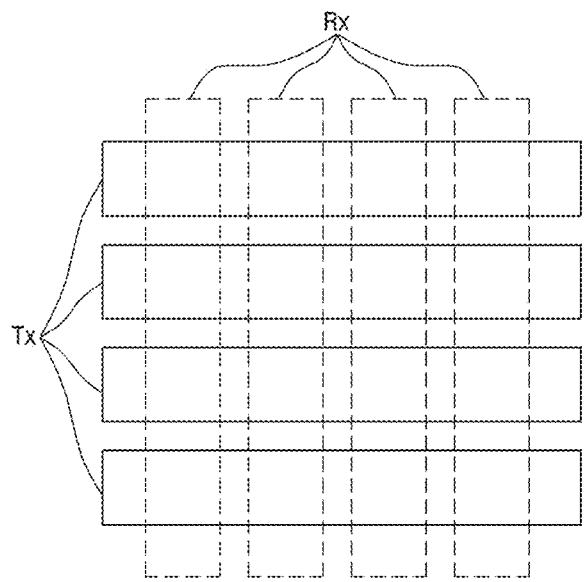

[Figure 7]
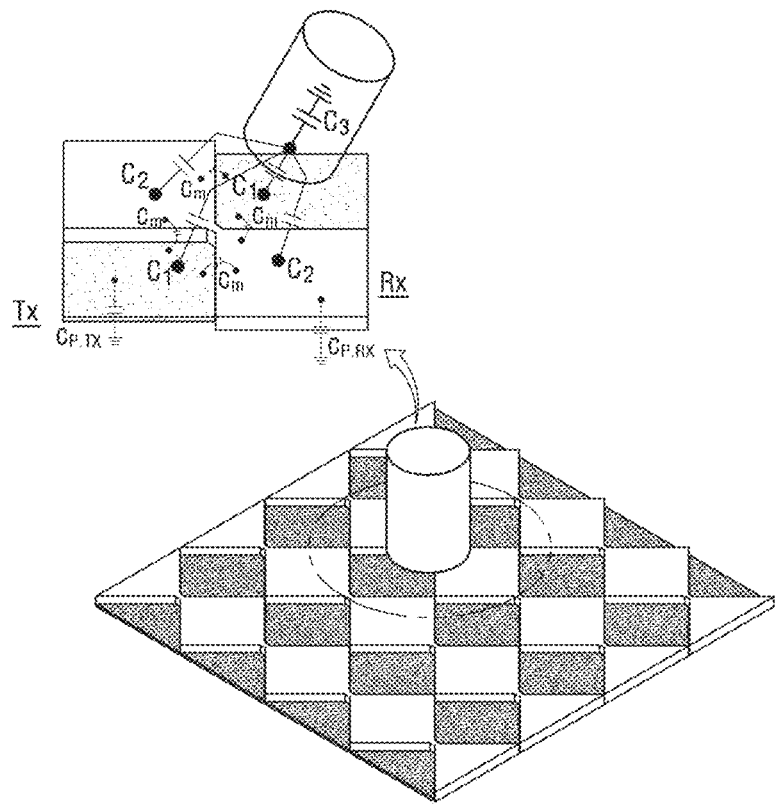
[Figure 8]
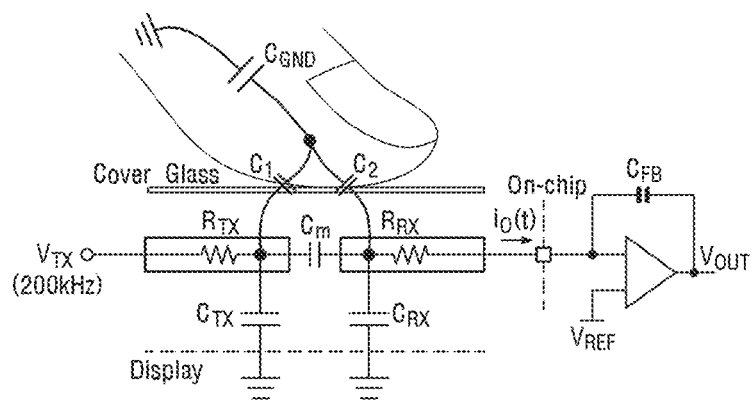

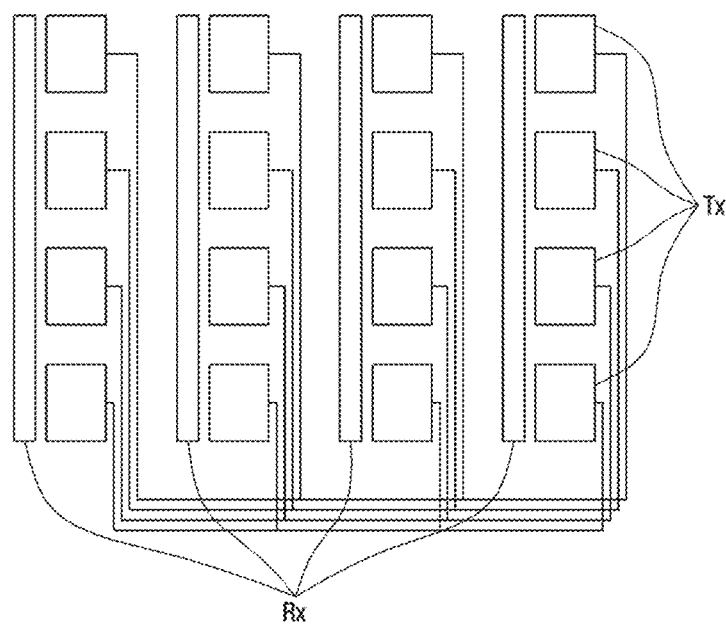
[Figure 9]

[Figure 14]
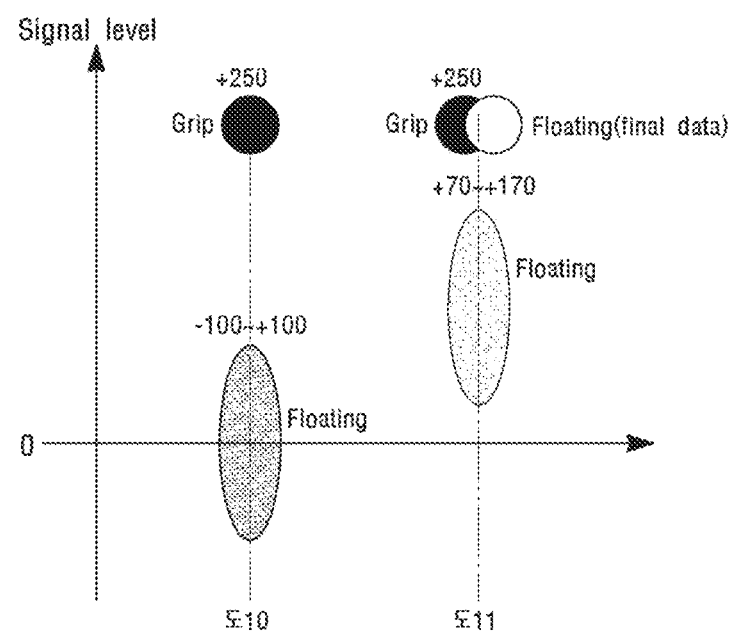

[Figure 17]
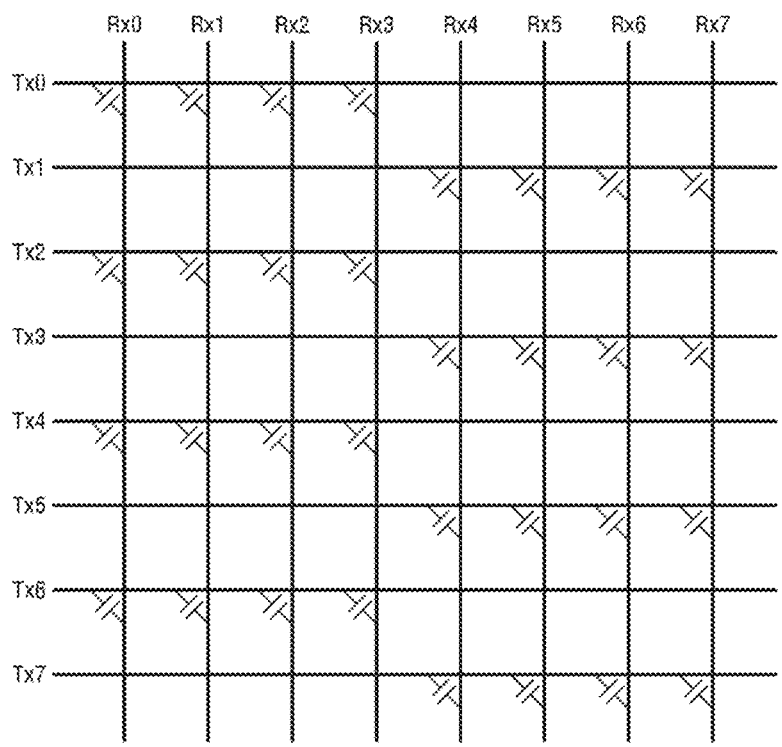
[Figure 18]
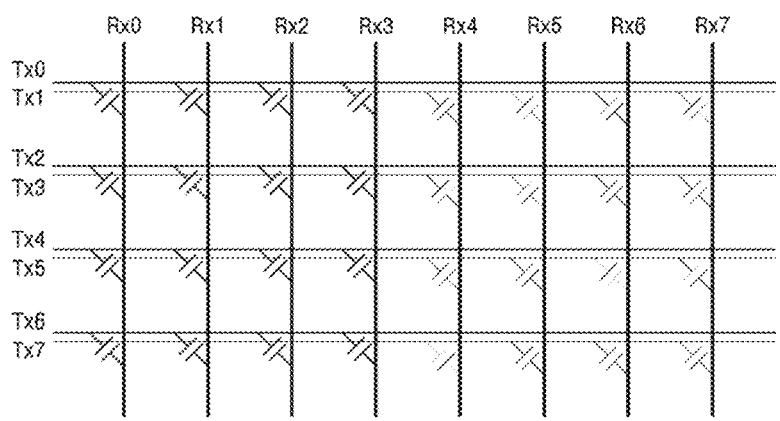

[Figure 19]
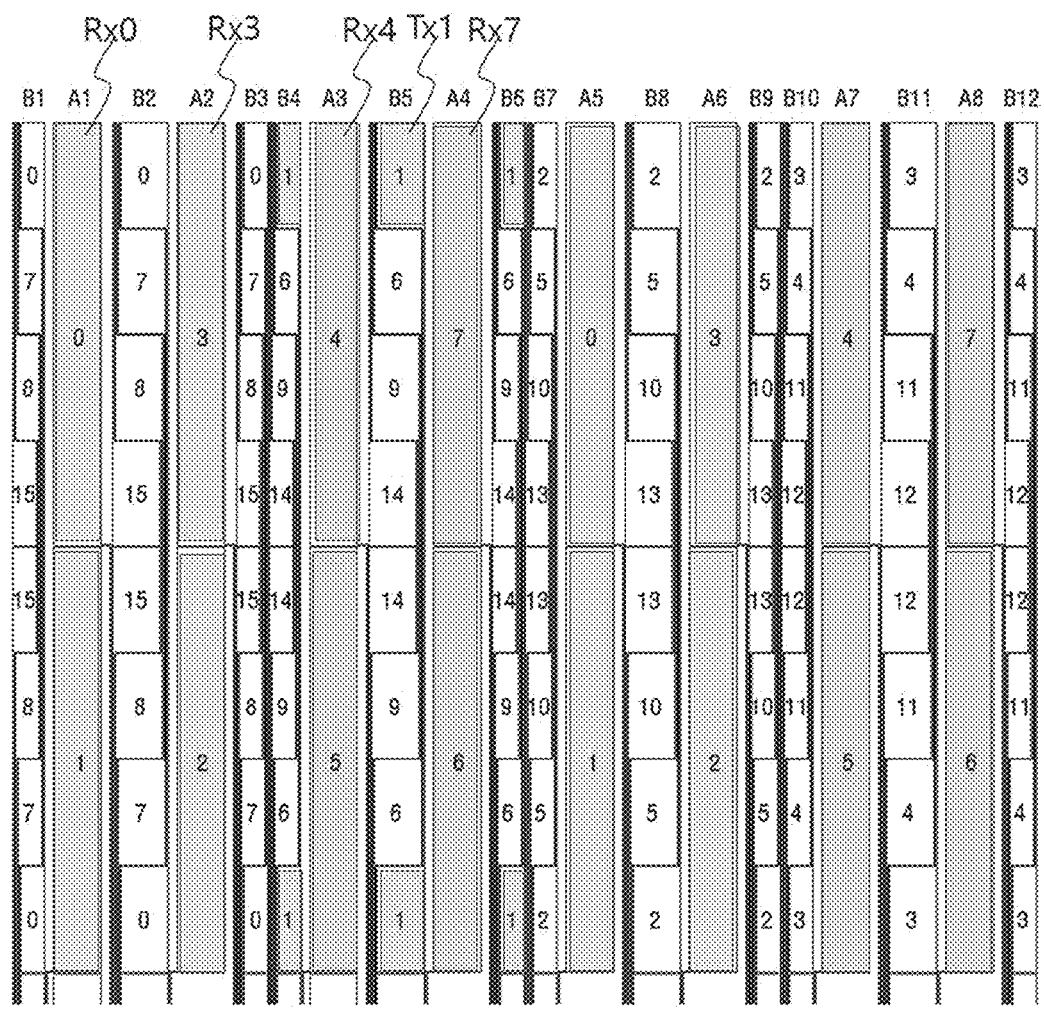

[Figure 21]
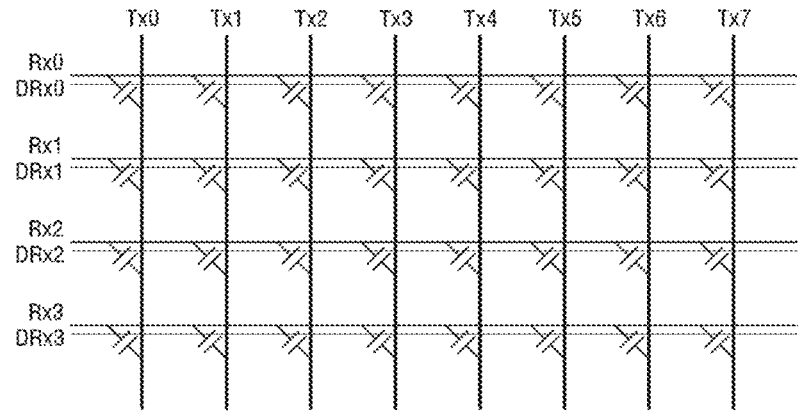
[Figure 22]
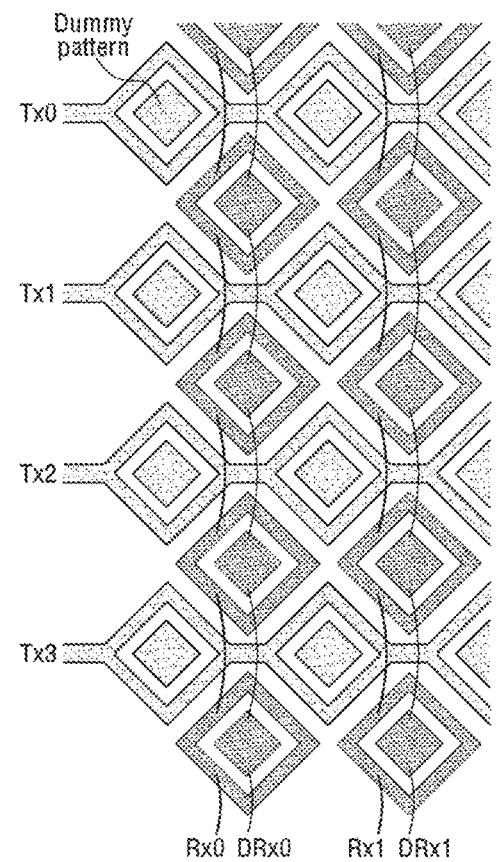

[Figure 23]
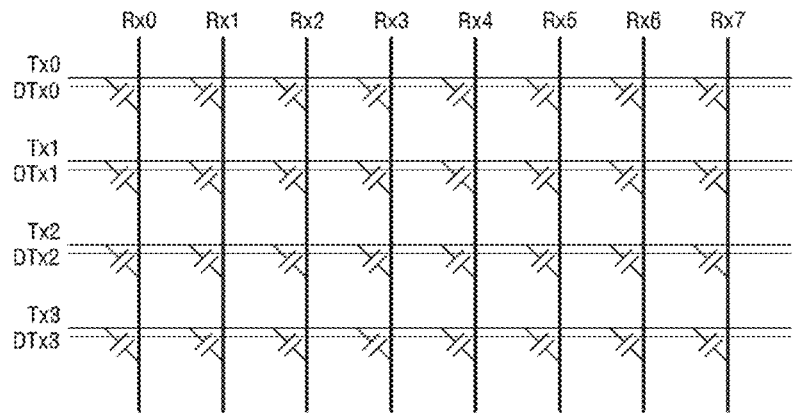
[Figure 24]
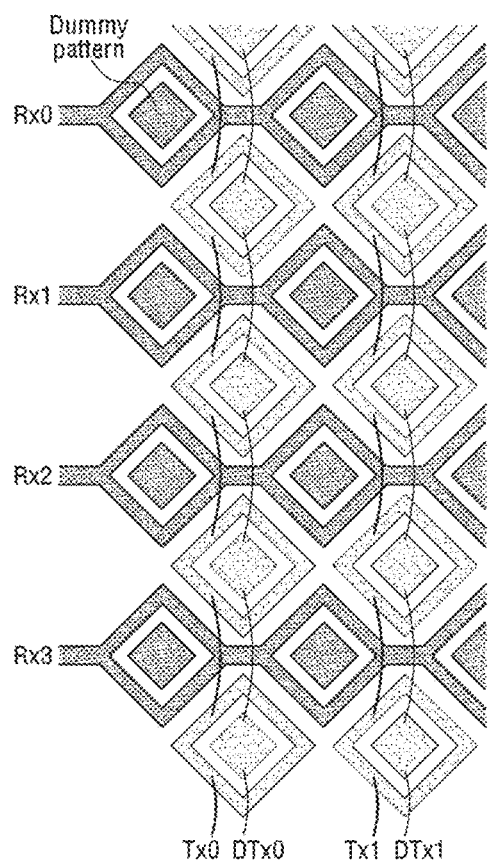

[Figure 25]
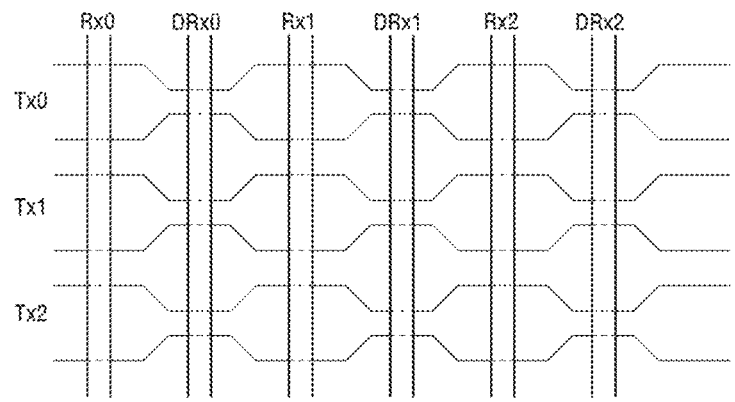
[Figure 26]
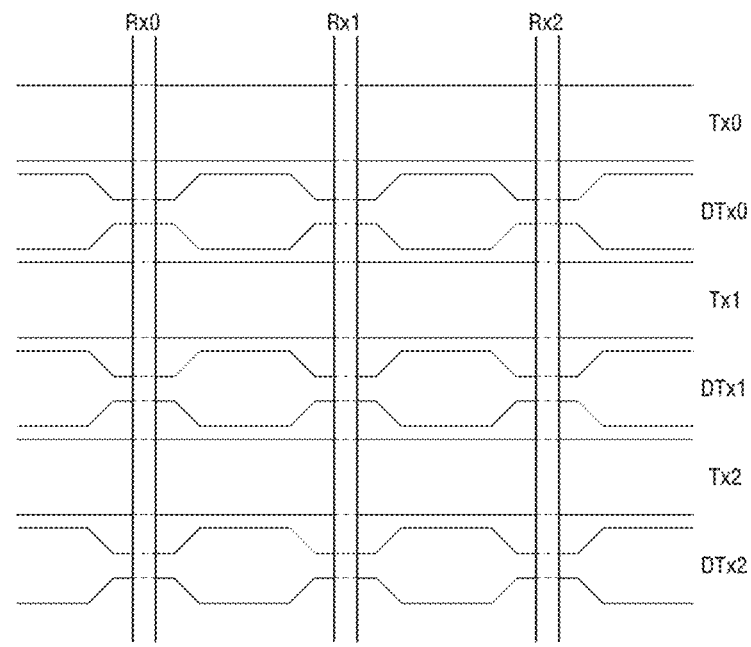

[Figure 35]
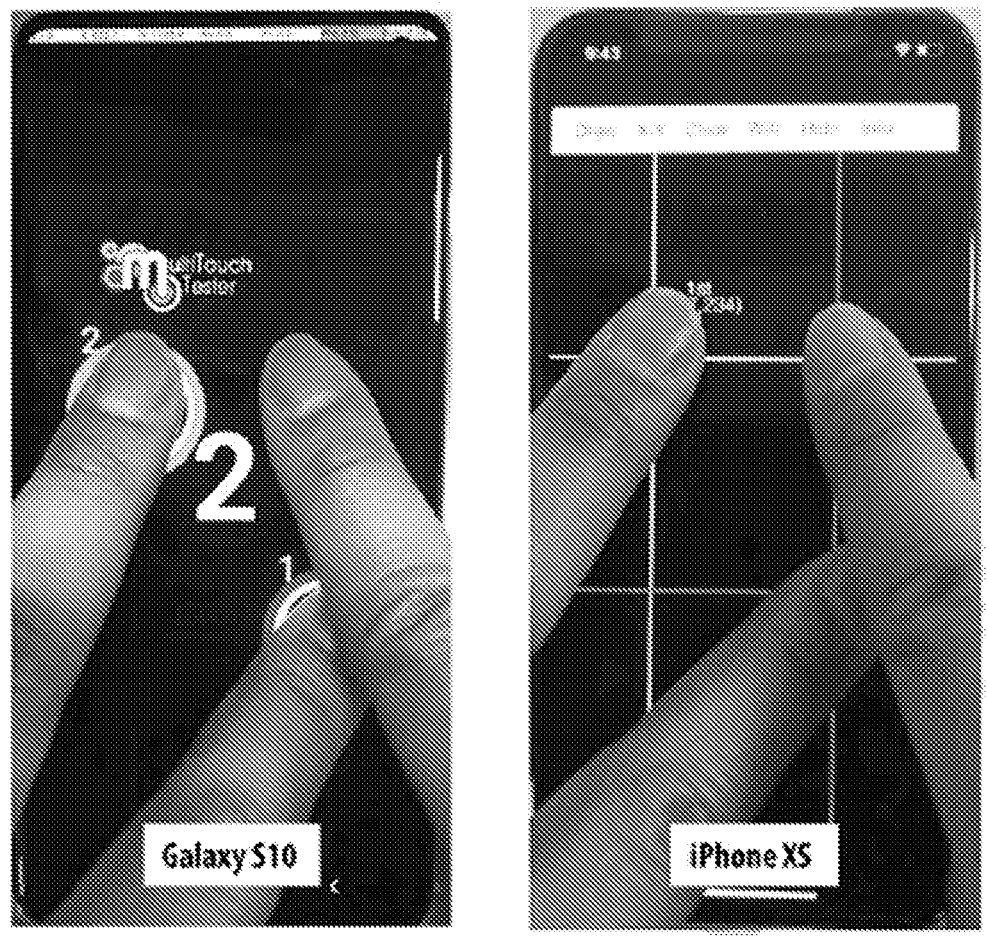

INPUT TOUCH DEVICE THAT DETECTS THE AMOUNT OF NEGATIVE CAPACITANCE CHANGE DUE TO COUPLING BETWEEN AN OBJECT AND A PREDETERMINED DRIVING ELECTRODE

CROSS REFERENCE TO RELATED PATENT APPLICATIONS

The present application is a U.S. national stage application under 35 U.S.C. § 371 of PCT Application No. PCT/KR2020/001925, filed Feb. 11, 2020, which claims priority to Korean Patent Application No. 10-2019-0038292, filed Apr. 2, 2019. The disclosures of the aforementioned priority applications are incorporated herein by reference in their entireties.

TECHNICAL FIELD

The present invention relates to a touch input device, and more particularly, to a touch input device including a touch sensor, which is capable of accurately detecting whether a touch input to a touch surface by an object is input or/and a touch position in a situation where the touch input device is in a floating state.

BACKGROUND ART

Various types of input devices are used to operate a computing system. For example, the input devices, such as a button, a key, a joystick, and a touch screen, are used. Due to the easy and convenient operation of the touch screen, the use of the touch screen is increasing in the operation of computing systems.

The touch screen may configure a touch surface of a touch input device including a touch sensor panel that may be a transparent panel provided with a touch-sensitive surface. The touch sensor panel is attached to a front surface of a display screen, so that a touch-sensitive surface may cover a viewed surface of the display screen. A user is allowed to operate a computing system by simply touching the touch screen with a finger and the like. In general, the computing system recognizes a touch and a touch position on a touch screen and interprets the touch to perform a calculation according to the interpretation.

In the case where driving electrodes and receiving electrodes are implemented in the same layer or dual layers, when a touch input device, such as a smart phone, equipped with a touch sensor, is touched without being held by hand (floating state), a signal that should be normally detected disappears or a signal to be detected is split by Low Ground Mass (LGM), or a signal to be detected is split, so that there are cases where a signal appears as two or more points are touched.

DISCLOSURE

Technical Problem

An object to be solved by the present invention is to provide a touch sensor capable of detecting a touch signal in the same or similar manner to a grip state of a touch input device even in a floating state of the touch input device, and a touch input device including the same.

Further, the present invention provides a touch sensor capable of recognizing two or more multi-touches even in the state where a touch input device is in a floating state, and a touch input device including the same.

Furthermore, the present invention provides a touch sensor capable of recognizing a third touch touched together with a cross touch, and a touch input device including the same.

Technical Solution

A touch input device according to an exemplary embodiment is a touch input device including a touch surface, including: a touch sensor which is disposed under the touch surface and includes a plurality of driving electrodes, a plurality of receiving electrodes, and a plurality of dummy receiving electrodes; and a touch detection unit configured to detect a touch position of an object input to the touch surface based on a detection signal output from the plurality of receiving electrodes of the touch sensor, in which the touch detection unit detects the touch position of the object input to the touch surface by subtracting a second detection signal output from a dummy receiving electrode that does not form mutual capacitance with the predetermined driving electrode among the plurality of dummy receiving electrodes from a first detection signal output from a predetermined receiving electrode that forms mutual capacitance with the predetermined driving electrode among the plurality of receiving electrodes.

A touch input device according to another exemplary embodiment is a touch input device including a touch surface, including: a touch sensor which is disposed under the touch surface and includes a plurality of driving electrodes, a plurality of receiving electrodes, and a plurality of dummy driving electrodes; and a touch detection unit configured to detect a touch position of an object input to the touch surface based on a detection signal output from the plurality of receiving electrodes of the touch sensor, in which the touch detection unit detects the touch position of the object input to the touch surface by subtracting a second detection signal output from a predetermined receiving electrode that does not form mutual capacitance with a predetermined dummy driving electrode among the plurality of receiving electrodes from a first detection signal output from a predetermined receiving electrode that forms mutual capacitance with a predetermined driving electrode among the plurality of receiving electrodes.

A touch input device according to still another exemplary embodiment is a touch input device including a touch surface, including: a touch sensor which is disposed under the touch surface and includes a plurality of driving electrodes and a plurality of receiving electrodes; and a touch detection unit configured to detect a touch position of an object input to the touch surface based on a detection signal output from the plurality of receiving electrodes of the touch sensor, in which the touch detection unit detects the touch position of the object input to the touch surface by subtracting a second detection signal output from another predetermined receiving electrode that does not form mutual capacitance with a predetermined driving electrode among the plurality of receiving electrodes from a first detection signal output from a predetermined receiving electrode that forms mutual capacitance with the predetermined driving electrode among the plurality of receiving electrodes.

A touch sensor according to an exemplary embodiment includes: a plurality of driving electrodes; a plurality of receiving electrodes which is electrically insulated from the plurality of driving electrodes, and forms mutual capacitance with the plurality of driving electrodes; and a plurality of dummy receiving electrodes which is electrically insulated from the plurality of driving electrodes and the plurality of receiving electrodes, and does not form mutual capacitance with the plurality of driving electrodes, in which when a driving signal is applied through a predetermined driving electrode among the plurality of driving electrodes, a first detection signal output from a predetermined receiving electrode among the plurality of receiving electrodes includes information on the amount of mutual capacitance changed between the predetermined driving electrode and the predetermined receiving electrode and noise information, a second detection signal output from a predetermined dummy receiving electrode among the plurality of dummy receiving electrodes includes the noise information, and the noise information includes information on the amount of negative (−) capacitance changed by an LGM jamming signal generated by coupling between an object and the predetermined driving electrode.

A touch sensor according to another exemplary embodiment includes: a plurality of driving electrodes; and a plurality of dummy driving electrodes electrically insulated from the plurality of driving electrodes; and a plurality of receiving electrodes which is electrically insulated from the plurality of driving electrodes and the plurality of dummy driving electrodes, forms mutual capacitance with the plurality of driving electrodes, and does not form the mutual capacitance with the plurality of dummy driving electrodes, in which a predetermined receiving electrode among the plurality of receiving electrodes outputs a first detection signal and a second detection signal, the first detection signal includes information on the amount of mutual capacitance changed between the predetermined receiving electrode and a predetermined driving electrode among the plurality of driving electrodes and noise information, a second detection signal includes the noise information, and the noise information includes information on the amount of negative (−) capacitance changed by an LGM jamming signal generated by coupling between an object and the predetermined driving electrode.

A touch sensor according to still another exemplary embodiment includes: a plurality of driving electrodes; and a plurality of receiving electrodes which is electrically insulated from the plurality of driving electrodes, in which when a driving signal is applied through a predetermined driving electrode among the plurality of driving electrodes, a first detection signal output from a first receiving electrode that forms mutual capacitance with the predetermined driving electrode among the plurality of receiving electrodes includes information on the amount of mutual capacitance changed between the predetermined driving electrode and the first receiving electrode and noise information, a second detection signal output from a second receiving electrode that does not form the mutual capacitance with the predetermined driving electrode among the plurality of receiving electrodes includes the noise information, and the noise information includes information on the amount of negative (−) capacitance changed by an LGM jamming signal generated by coupling between an object and the predetermined driving electrode.

Advantageous Effects

When the touch sensor according to the exemplary embodiment of the present invention and the touch input device including the same are used, there is an advantage in that a touch signal may be detected even in the state where the touch input device is in a floating state identically or similarly to the state where the touch input state is in a grip state.

Further, there is an advantage in that the touch input device is capable of recognizing two or more multi-touches even in a floating state.

Further, there is an advantage in that the touch input device is capable of recognizing a third touch touched together with a cross touch.

DESCRIPTION OF DRAWINGS

FIG. 1 is a schematic diagram illustrating a touch sensor 10 in a general touch input device and a configuration for operating the touch sensor.

FIGS. 2 and 3 are diagrams illustrating an example of a touch sensor having a dual-layer structure.

FIGS. 5 and 6 are output data for explaining why an LGM jamming signal is generated in the touch input device including the touch sensor illustrated in FIG. 2 or/and FIG. 3.

FIGS. 7 and 8 are diagrams for explaining a principle of generating an LGM jamming signal in the state where a touch input device including a touch sensor implemented with dual layers (two layers) is in a floating state.

FIG. 9 is a diagram illustrating an example in which a touch sensor 10 illustrated in FIG. 1 is configured with a single layer (one layer).

FIG. 10 is a diagram illustrating another example in which the touch sensor 10 illustrated in FIG. 1 is formed with a single layer (one layer), and is an enlarged view of only a part.

FIGS. 11A-B represent raw data output in a touch input device when an object, such as a thumb, is in contact with a specific portion of a touch surface of a touch input device having a structure of a touch sensor illustrated in FIG. 10.

FIG. 12 is a diagram illustrating another example in which the touch sensor 10 illustrated in FIG. 1 is formed in a single layer (one layer), and is an enlarged diagram of only a part.

FIG. 13 represents raw data when an object, such as a thumb, is in contact with a specific portion of a touch surface of a touch input device having a structure of a touch sensor illustrated in FIG. 12.

FIG. 14 is a graph representing a rough comparison of LGM performance between the touch sensors illustrated in FIGS. 10 and 12.

FIG. 17 is one exemplary conceptual diagram in which a touch sensor according to an exemplary embodiment of the present invention is conceptualized.

FIG. 18 is a conceptual diagram in which a touch sensor according to an exemplary embodiment of the present invention illustrated in FIG. 12 is conceptualized.

FIG. 19 is a diagram illustrating an example for describing electrodes used as dummy receiving electrodes among a plurality of receiving electrodes of the touch sensor illustrated in FIG. 12.

FIG. 21 is a conceptual diagram illustrating a touch sensor according to an exemplary embodiment of the present invention having a bridge structure is conceptualized.

FIG. 22 is a configuration diagram of a touch sensor according to an example to which the conceptual diagram of the touch sensor illustrated in FIG. 21 is applicable.

FIG. 23 is another conceptual diagram in which the touch sensor according to the exemplary embodiment of the present invention having the bridge structure is conceptualized.

FIG. 24 is a configuration diagram of a touch sensor according to an example to which the conceptual diagram of the touch sensor illustrated in FIG. 23 is applicable.

FIG. 25 is a configuration diagram of a touch sensor according to another example to which the conceptual diagram of the touch sensor illustrated in FIG. 21 is applicable.

FIG. 26 is a configuration diagram of a touch sensor according to another example to which the conceptual diagram of the touch sensor illustrated in FIG. 23 is applicable.

FIG. 27 is raw data output from each of a state where a touch input device including a touch sensor illustrated in FIG. 10 is in a grip state and a state where a touch input device including a touch sensor illustrated in FIG. 10 is in a floating state when a test is performed using a conductive rod of 15 phi.

FIG. 28 is raw data output from each of a state where a touch input device according to an exemplary embodiment of the present invention including a touch sensor illustrated in FIG. 12 is in a grip state and a state where a touch input device according to an exemplary embodiment of the present invention including a touch sensor illustrated in FIG. 12 is in a floating state when a test is performed using a conductive rod of 15 phi.

FIG. 29 is raw data output from each of a state where a touch input device including a touch sensor illustrated in FIG. 10 is in a grip state and a state where a touch input device including a touch sensor illustrated in FIG. 10 is in a floating state when a test is performed using a conductive rod of 20 phi.

FIG. 30 is raw data output from each of a state where a touch input device according to an exemplary embodiment of the present invention including a touch sensor illustrated in FIG. 12 is in a grip state and a state where a touch input device according to an exemplary embodiment of the present invention including a touch sensor illustrated in FIG. 12 is in a floating state when a test is performed using a conductive rod of 20 phi.

FIG. 31 is raw data output from each of a state where a touch input device including a touch sensor illustrated in FIG. 10 is in a grip state and a state where a touch input device including a touch sensor illustrated in FIG. 10 is in a floating state when a test is performed using a thumb of a person.

FIG. 32 is raw data output from each of a state where a touch input device according to an exemplary embodiment of the present invention including a touch sensor illustrated in FIG. 12 is in a grip state and a state where a touch input device according to an exemplary embodiment of the present invention including a touch sensor illustrated in FIG. 12 is in a floating state when a test is performed using a thumb of a person.

FIG. 35 is a diagram illustrating the case where a third touch is not recognized when a cross touch and the third touch are input together to touch surfaces of the touch input devices in the related art.

MODE FOR INVENTION

Figure 3:
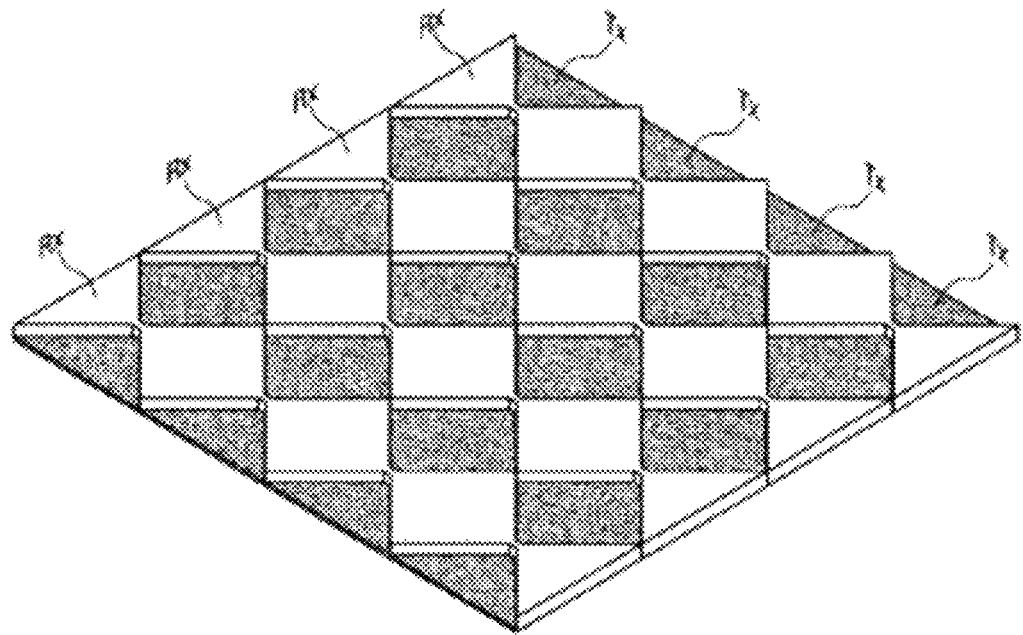

In the detailed description of the present invention described below, reference is made to the accompanying drawings, which illustrate a specific exemplary embodiment in which the present invention may be carried out, as an example. The exemplary embodiment is described in detail sufficient to enable a person skilled in the art to carry out the present invention. It should be understood that various exemplary embodiments of the present invention are different from each other, but need not to be mutually exclusive. For example, specific shapes, structures, and characteristics described herein may be implemented in other exemplary embodiments without departing from the spirit and the scope of the present invention in relation to one exemplary embodiment. Further, it should be understood that a location or disposition of an individual component in each disclosed exemplary embodiment may be changed without departing from the spirit and the scope of the present invention. Accordingly, the detailed description below is not intended to be taken in a limited meaning, and the scope of the present invention, if appropriately described, is limited only by the appended claims along with all scopes equivalent to those claimed by the claims. Like reference numerals in the drawings refer to the same or similar functions over several aspects.

Hereinafter, a touch sensor according to an exemplary embodiment of the present invention and a touch input device including the same will be described with reference to the accompanying drawings. Hereinafter, a capacitive touch sensor 10 is exemplified, but the present invention may also be identically/similarly applied to a touch sensor 10 capable of detecting a touch position by a predetermined method.

FIG. 1 is a schematic diagram illustrating a touch sensor 10 in a general touch input device and a configuration for operating the touch sensor.

Referring to FIG. 1, the touch sensor 10 may include a predetermined shape of patterns, and the predetermined patterns may include a plurality of driving electrodes TX0 to TXn and a plurality of receiving electrodes RX0 to RXm.

For an operation of the touch sensor 10, the touch sensor 10 may include a driving unit 12 which applies a driving signal to the plurality of driving electrodes TX0 to TXn, and a detection unit 11 which receives a detection signal including information about the amount of changed capacitance changed according to a touch to a touch surface from the plurality of receiving electrodes RX0 to RXm and detects a touch and a touch position.

FIG. 1 illustrates the case where the plurality of driving electrodes TX0 to TXn and the plurality of receiving electrodes RX0 to RXm of the touch sensor 10 configure an orthogonal array, but the present invention is not limited thereto, and the plurality of driving electrodes TX0 to TXn and the plurality of receiving electrodes RX0 to RXm may have any number of dimensions and applications arrangements thereof including a diagonal arrangement, a concentric arrangement, and a three-dimensional random arrangement. Herein, n and m are positive integers, and may have the same or different values, and have different sizes depending on an exemplary embodiment.

The plurality of driving electrodes TX0 to TXn and the plurality of receiving electrodes RX0 to RXm may be arranged to cross each other as illustrated in FIGS. 2 and 3. The driving electrode TX may include the plurality of driving electrodes TX0 to TXn extending in a first axis direction, and the receiving electrode RX may include the plurality of receiving electrodes RX0 to RXm extending in a second axis direction crossing the first axis direction.

The plurality of driving electrodes TX0 to TXn and the plurality of receiving electrodes RX0 to RXm may be formed on different dual layers (two layers) as illustrated in FIGS. 2 and 3. For example, the plurality of driving electrodes TX0 to TXn and the plurality of receiving electrodes RX0 to RXm may have a bar pattern as illustrated in FIG. 2, and may be a diamond pattern as illustrated in FIG. 3. Herein, the layer on which the plurality of driving electrodes TX0 to TXn is formed may also be disposed on a layer on which the plurality of receiving electrodes RX0 to RXm is formed, or the layers may be disposed in reverse. An insulating layer for preventing short-circuit between the plurality of driving electrodes and the plurality of receiving electrodes may be formed between the dual layers.

Figure 4A:
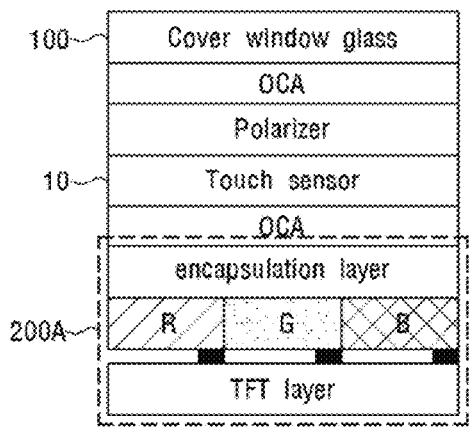
FIGS. 4A-F are exemplary cross-sectional structural views of a touch input device including a touch sensor.
Figure 4B:
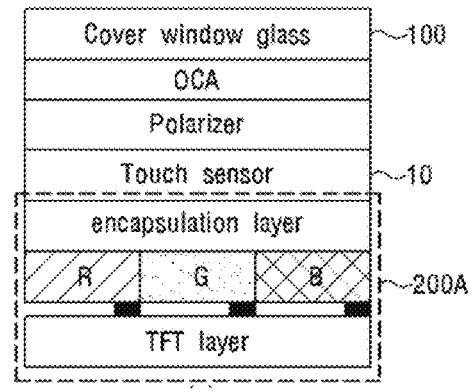

The touch sensor 10 including the plurality of driving electrodes TX0 to TXn and the plurality of receiving electrodes RX0 to RXm may be disposed between a cover layer 100 and a display panel 200A together with OCA disposed above and beneath the touch sensor 10 (add-on) as illustrated in FIG. 4A. As illustrated in FIG. 4B, the touch sensor 10 may be directly disposed on an upper surface of the display panel 200A (for example, an upper surface of an encapsulation layer of the display panel 200A) (on-cell). In the meantime, the touch sensor 10 including the plurality of driving electrodes TX0 to TXn and the plurality of receiving electrodes RX0 to RXm may be disposed inside the display panel 200A (for example, between the encapsulation layer and an organic light emitting layer of the display panel 200A) (in-cell) as illustrated in FIG. 4C.

Figure 4C:
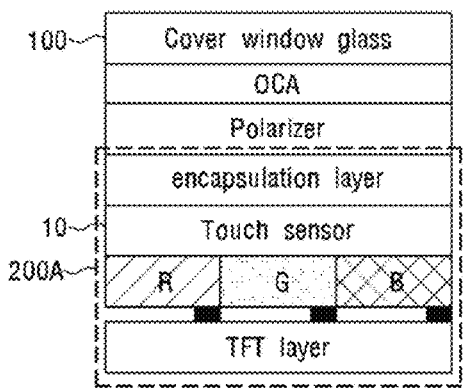

In FIGS. 4A-C, the display panel 200A may be a rigid OLED panel, and may be a flexible OLED panel. When the display panel 200A is the rigid OLED panel, the encapsulation layer and a TFT layer may be formed of glass, and when the display panel 200A is the flexible OLED panel, the encapsulation layer may be formed of a thin film and a TFT layer may be formed of a PI film.

Figure 4D:
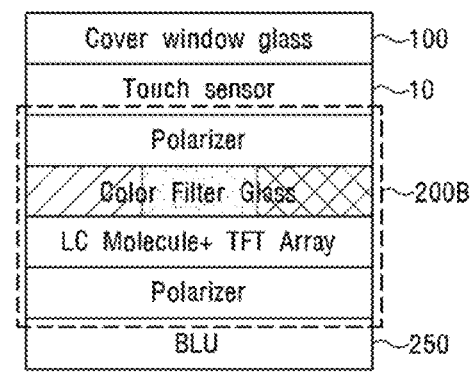
Figure 4E:
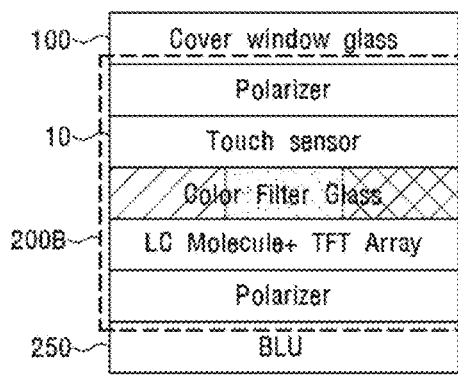
Figure 4F:
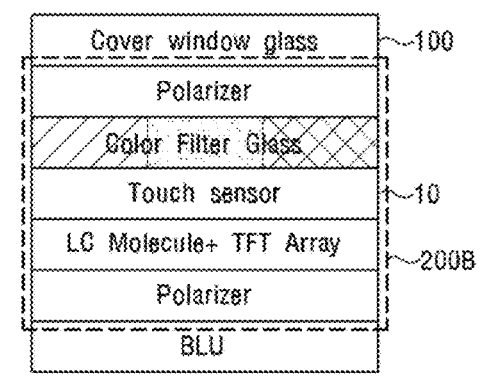

In the meantime, in FIGS. 4A-C, the display panel 200A is illustrated as an OLED panel, but the present invention is not limited thereto, and a display panel 200B may also be an LCD panel as illustrated in FIGS. 4D-F. According to a characteristic of the LCD panel, a backlight unit (BLU) 250 is disposed under the display panel 200B.

In particular, as illustrated in FIG. 4D, the touch sensor 10 may be added on a cover window glass 100. Herein, although not illustrated in the drawing, the touch sensor 10 may also be added on an upper surface of the cover window glass 100 in the form of a film. As illustrated in FIG. 4E, the touch sensor 10 may be formed on a color filter glass of the display panel 200B (on-cell). Herein, the touch sensor 10 may also be formed on the upper surface of the color filter glass as illustrated in the drawing, and although not illustrated in the drawing, the touch sensor 10 may also be formed on a lower surface of the color filter glass. As illustrated in FIG. 4F, the touch sensor 10 may be formed on a TFT layer (TFT array) (in-cell). Herein, the touch sensor 10 may also be formed on an upper surface of the TFT layer (TFT array) as illustrated in the drawing, and although not illustrated in the drawing, the touch sensor 10 may also be formed on a lower surface of the TFT layer (TFT array). Further, although not illustrated in a separate drawing, one of the driving electrode and the receiving electrode may be formed on the color filter glass of the display panel 200B and the remaining one may also be formed on the TFT layer.

Referring back to FIG. 1, the plurality of driving electrodes TX0 to TXn and the plurality of receiving electrodes RX0 to RXm may be made of a transparent conductive material (for example, indium tin oxide (ITO) or antimony tin oxide (ATO) made of tin oxide ($SnO_2$) and indium oxide ($In_2O_3$)). However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT). Further, the driving electrode TX and the receiving electrode RX may be implemented with a metal mesh.

The driving unit 12 may apply a driving signal to the driving electrodes TX0 to TXn. The detection unit 11 may detect whether a touch is input and a touch position by receiving a detection signal including information about the amount of mutual capacitance (Cm: 14) changed generated between the driving electrodes TX0 to TXn and the receiving electrodes RX0 to RXm to which the driving signal is applied through the receiving electrodes RX0 to RXm. The detection signal includes a noise signal, as well as a signal in which the driving signal applied to the driving electrode TX is coupled by mutual capacitance (Cm: 14) generated between the driving electrode TX and the receiving electrode RX. The noise signal may include display noise information (for example, Zebra noise), information about the amount of change according to the change in an image displayed on the display, and information on an LGM jamming signal (for example, the amount of negative (−) capacitance changed) generated in a floating state.

The detection unit 11 may include a receiver (not illustrated) connected with each of the receiving electrodes RX0 to RXm through a switch. The switch is turned on in a time period for detecting the signal of the corresponding receiving electrode RX so that the sensing signal from the receiving electrode RX may be detected by the receiver. The receiver may include an amplifier (not illustrated) and a feedback capacitor coupled between a negative (−) input terminal of the amplifier and an output terminal of the amplifier, that is, a feedback path. In this case, a positive (+) input terminal of the amplifier may be connected to ground. Further, the receiver may further include a reset switch connected to the feedback capacitor in parallel. The reset switch may reset a conversion from a current to a voltage performed in the receiver. The negative input terminal of the amplifier may be connected to the corresponding receiving electrode RX and receive a current signal including information on the capacitance (Cm: 14) and then integrate the received current signal and convert the integrated current signal to a voltage. The detection unit 11 may further include an analog to digital converter (ADC) (not illustrated) which converts the data integrated through the receiver to digital data value. Later, the digital data may be input to a processor (not illustrated) and processed so as to obtain touch information for the touch sensor 10. The detection unit 11 may include the ADC and the processor together with the receiver.

A control unit 13 may perform a function of controlling the operations of the driving unit 12 and the detection unit 11. For example, the control unit 13 may generate a driving control signal and then transmit the generated driving control signal to the driving unit 12 so that the driving signal is applied to a predetermined driving electrode TX at a predetermined time. Further, the control unit 13 may generate a detection control signal and then transmit the generated detection control signal to the detection unit 11 to make the detection unit 11 receive the detection signal from a predetermined receiving electrode RX at a predetermined time and perform a predetermined function.

In FIG. 1, the driving unit 12 and the detection unit 11 may configure a touch detection unit (not illustrated) which is capable of detecting whether a touch is input to the touch sensor 10 and a touch position. Further, the touch detection unit may further include the control unit 13. The touch detection unit may be integrated on a touch sensing Integrated Circuit (IC). The driving electrode TX and the receiving electrode RX included in the touch sensor 10 may be connected to the driving unit 12 and the detection unit 11 included in the touch sensing IC through, for example, a conductive trace and/or a conductive pattern printed on a circuit board. The touch sensing IC may be positioned on a circuit board on which a conductive pattern is printed, for example, a touch circuit board (hereinafter, referred to as a touch PCB). According to the exemplary embodiment, the touch sensing IC may be mounted on a main board for operating the touch input device.

As described above, predetermined capacitance (Cm) is generated at each crossing point of the driving electrode TX and the receiving electrode RX, and when an object, such as a finger, approaches the touch sensor 10, a value of the capacitance (Cm) may be changed. In FIG. 1, the capacitance may represent mutual capacitance (Cm). The detection unit 11 may detect the electric characteristic to detect whether a touch is input to the touch sensor 10 and/or a touch position. For example, the detection unit 10 may detect whether a touch is input for the surface of the touch sensor 10, which is formed of a two-dimensional plane consisting of a first axis and a second axis, and/or the position of the touch.

Figure 5:
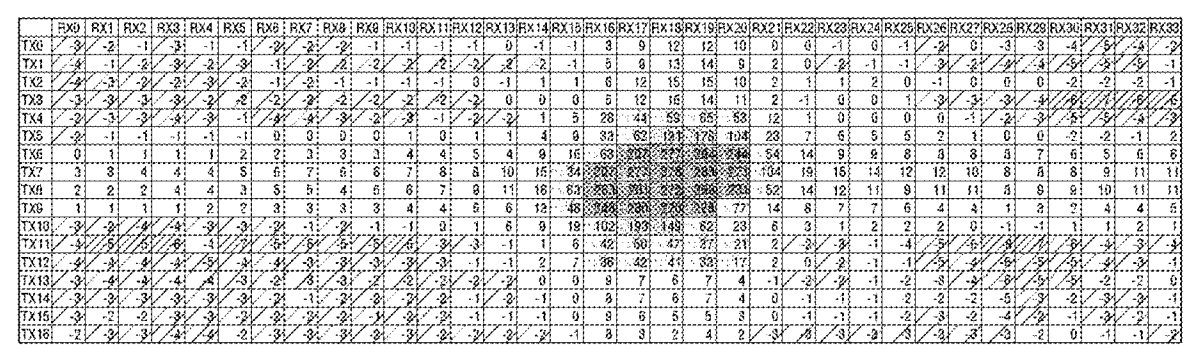
Figure 6:
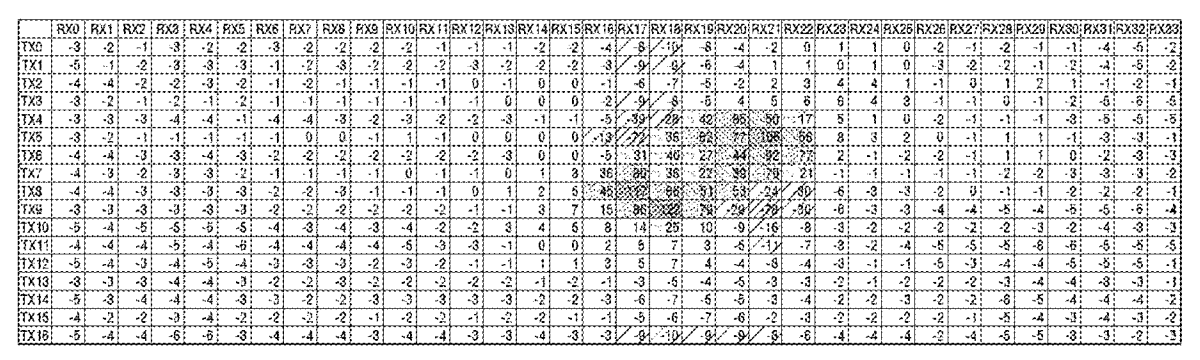

FIGS. 5 and 6 are output data for explaining why an LGM jamming signal is generated in the touch input device including the touch sensor illustrated in FIG. 2 or/and FIG. 3.

FIG. 5 illustrates data in which a detection signal output through the receiving electrodes RX0 to RX33 is converted to a digital value (or a signal level value) in the case where an object is in contact with a specific portion of a touch surface of the touch input device illustrated in FIG. 2 or FIG. 3 in a normal situation in which the touch input device is gripped, and FIG. 6 illustrates data in which a detection signal output through the receiving electrodes RX0 to RX33 is converted to a digital value (or a signal level value) in the case where an object is in contact with the specific portion of the touch surface of the touch input device illustrated in FIG. 2 or FIG. 3 in the state where the touch input device is in a floated state.

As illustrated in FIG. 5, in the normal situation, a region in which digital values having a relatively large value among the output digital values are distributed is located in the center part. However, as illustrated in FIG. 6, in the floating state, the digital values in the center part have a completely different aspect from that of FIG. 5. That is, in FIG. 6, the digital values of the center part have relatively low values. In this case, even though a user actually makes one touch (or big touch) on the touch surface of the touch input device, the touch input device may erroneously recognize that the one touch is not performed or the one touch is two or more touches. This is due to the amount of negative (−) capacitance changed by the LGM jamming signal generated by the coupling between the object and the driving electrode.

The normal situation of FIG. 5 is the situation in which the user touches the touch surface of the touch input device with his/her finger in the state where the user grips the touch input device, and the finger acts as normal ground. Further, the floating state illustrated in FIG. 6 exemplifies the situation where in the state where the touch input device is placed on the floor or a cradle (for example, a cradle inside a car), the user touches the touch surface of the touch input device with his/her finger, and the finger does not act as normal ground.

Hereinafter, the reason why the digital value (or the signal level value) output in the state where the touch input device illustrated in FIG. 6 is in the floating state is different from the digital value (or the signal level value) output in the normal situation will be described in detail with reference to FIGS. 7 to 9.

FIGS. 7 and 8 are diagrams for explaining a principle of generating an LGM jamming signal in the state where the touch input device including the touch sensor implemented with dual layers (two layers) is in the floating state. For reference, in the description below, the object may include a finger, a stylus, and the like.

Referring to FIGS. 7 and 8, in one predetermined cell region (including the plurality of driving electrodes and the plurality of receiving electrodes included in a dotted-line region), the amount of signal (hereinafter, referred to as the "LGM jamming signal") generated detected in Low Ground Mass (hereinafter, abbreviated as "LGM") is relatively increased. Accordingly, as illustrated in FIG. 6, the digital value corresponding to the finally output detection signal is decreased. In particular, in the case of the big touch (in the present invention, the big touch is defined as a case where the touch has a larger area than a touch area of the rest of the fingers, such as the touch area of the thumb), the LGM jamming signal is relatively increased.

As illustrated in FIGS. 7 and 8, the LGM jamming signal is generated by coupling capacitance (C1, C2, or CLGM) between the object and the driving electrode Tx and/or the receiving electrode Rx, in addition to mutual capacitance (ΔCm) between the driving electrode and the receiving electrode when the object touches the touch surface of the touch input device that is in the floating state.

FIG. 9 is a diagram illustrating an example in which the touch sensor 10 illustrated in FIG. 1 is configured with a single layer (one layer).

Referring to FIG. 9, the plurality of driving electrodes TX0 to TXm and the plurality of receiving electrodes RX0 to RXm illustrated in FIG. 1 are formed on one layer. For example, a set in which the plurality of driving electrodes Tx is disposed while being adjacent to one rectangular receiving electrode Rx may be arranged in the direction of the plurality of rows and columns. Herein, the number of driving electrodes Tx adjacent to one rectangular receiving electrode Rx may also be 4 as illustrated in the drawing, but the present invention is not limited thereto. For example, the number of driving electrodes Tx may be three, two, or five or more. Further, the driving electrode Tx and the receiving electrode Rx may be configured in reverse.

The touch input device including the touch sensor 10 having the single layer structure illustrated in FIG. 9 may exhibit different aspects according to the grip state and the floating state as illustrated in FIGS. 5 and 6. This is due to the fact that the object is placed in the LGM in the floating state.

In more particular, the driving signal applied through the specific driving electrode is input to the plurality of receiving electrodes RX that is in contact with the object through the object in the LGM state. That is, the object in the LGM state forms a current path. Accordingly, each of the receiving electrodes that is in contact with the object outputs the LMG jamming signal (−diff) having an opposite sign to that of a normal touch signal. Herein, the reason why the LGM jamming signal has the sign opposite to that of the normal touch signal is that in the normal touch signal, when the object is in contact with the receiving electrodes in the state where predetermined mutual capacitance (Cm) is formed between the driving electrode and the receiving electrode, the mutual capacitance (Cm) is decreased, but in the LGM jamming signal, the coupling capacitance is generated due to the contact of the object in the floating state, so that the LGM jamming signal and the normal touch signal have opposite signs. Accordingly, the LGM jamming signal generated in the floating state causes a decrease in the digital value (or the signal level value) corresponding to the detection signal output through each of the receiving electrodes.

Hereinafter, examples of the touch sensor in the single layer structure will be described in more detail with reference to FIGS. 10 and 12, and raw data output in the state where the touch input device including each touch sensor is in the floating state will be described.

Figure 10:
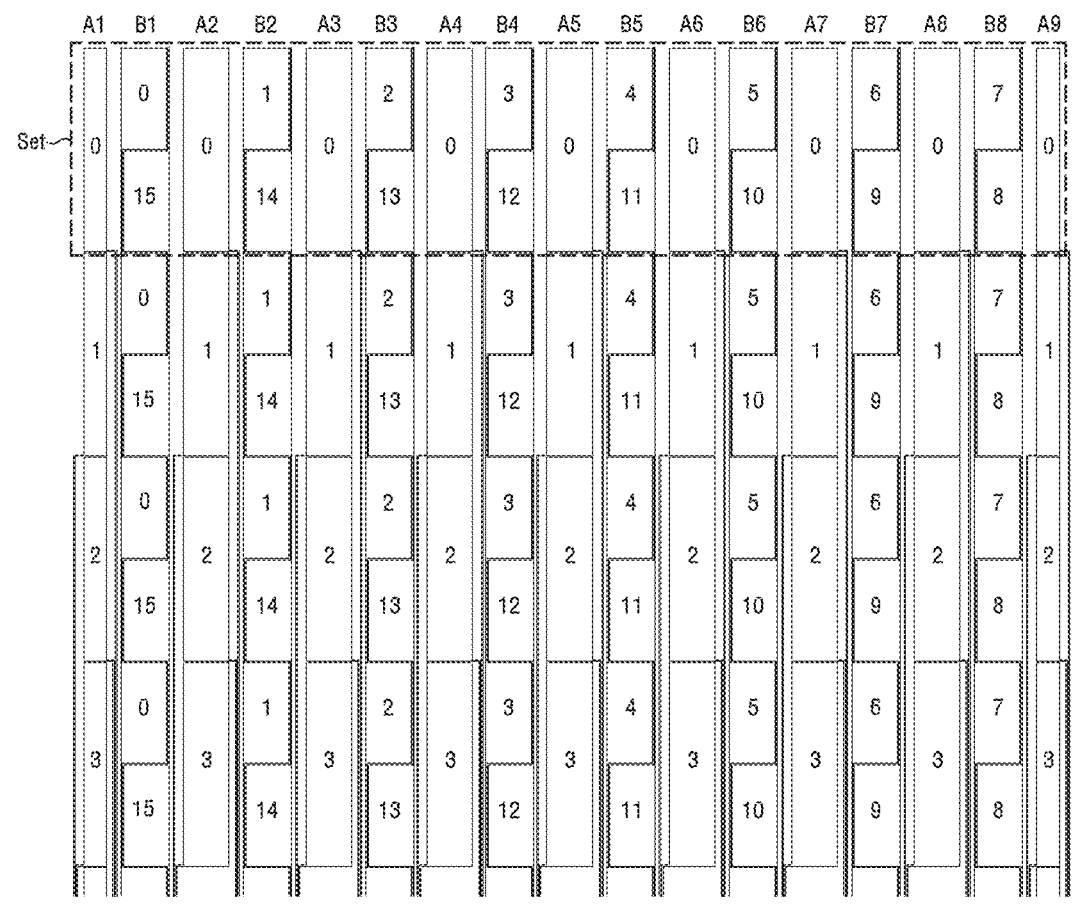

FIG. 10 is a diagram illustrating another example in which the touch sensor 10 illustrated in FIG. 1 is formed with a single layer (one layer), and is an enlarged view of only a part.

Referring to FIG. 10, the touch sensor includes the plurality of driving electrodes TX and the plurality of receiving electrodes RX. The plurality of driving electrodes TX and the plurality of receiving electrodes RX are arranged on the same layer in a matrix form.

The plurality of driving electrodes TX and the plurality of receiving electrodes RX may be made of a transparent conductive material (for example, indium tin oxide (ITO) or antimony tin oxide (ATO) made of tin oxide ($SnO_2$) and indium oxide ($In_2O_3$)) and the like. However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT).

Further, the driving electrode TX and the receiving electrode RX may be implemented with a metal mesh. When the driving electrode TX and the receiving electrode RX are implemented with the metal mesh, the wires connected to the driving electrode TX and the receiving electrode RX may also be implemented with the metal mesh, and the driving electrode TX and the receiving electrode RX and the wires may also be integrally implemented with the metal mesh. When the driving electrode TX, the receiving electrode RX, and the wires are integrally implemented with the metal mesh, a dead zone, such as a space between the electrode and the wire and/or a space between the electrode and another electrode, in which a touch position is not detected, is reduced, so that sensitivity of detecting a touch position may be further improved.

The touch sensor is arranged with respect to the plurality of receiving electrodes RX. Accordingly, hereinafter, the arrangement structure of the receiving electrodes RX disposed in plural in columns B1 to B8 will be first described, and then the arrangement structure of the plurality of driving electrodes TX will be described.

The plurality of receiving electrodes RX is arranged in each of the plurality of columns B1, B2, B3, B4, B5, B6, B7, and B8. Herein, the plurality of driving electrodes TX is arranged in the plurality of columns A1, A2, A3, A4, A5, A6, A7, A8, and A9 formed between the plurality of columns B1, B2, B3, B4, B5, B6, B7, and B8 in which the receiving electrodes RX are arranged, and B8, at the external side of the first column B1, and at the external side of the eighth column B8.

With respect to each receiving electrode RX of the plurality of receiving electrodes RX, the two driving electrodes TX adjacent to both sides are the same. That is, the two driving electrodes TX adjacent to both sides with respect to each receiving electrode RX have the same number. Herein, the meaning that the two driving electrodes TX are the same or that the numbers of the two driving electrodes TX are the same is that the two driving electrodes TX are electrically connected through wires.

The touch sensor includes one or more sets in which the plurality of receiving electrodes RX and the plurality of driving electrodes TX are disposed in a predetermined arrangement. The plurality of sets may be repeatedly arranged in the column direction.

One set may include the plurality of different receiving electrodes RX, and for example, one set may include 16 receiving electrodes including a $0^{th}$ receiving electrode RX0 to a $15^{th}$ receiving electrode RX15. The 16 receiving electrodes RX0, RX1, RX2, RX3, RX4, RX5, RX6, RX7, RX8, RX9, RX10, RX11, RX12, RX13, RX14, and RX15 may be disposed in a predetermined arrangement. The 16 receiving electrodes including the $0^{th}$ receiving electrode RX0 to the $15^{th}$ receiving electrode RX15 are divided and arranged in two rows consecutive in the column direction. Accordingly, the eight receiving electrodes may be disposed in each of the two rows. The receiving electrodes numbered from 0 to 7 are arranged from left to right in the order of RX0, RX1, RX2, RX3, RX4, RX5, RX6, and RX7 in a first row, and the receiving electrodes numbered from 8 to 15 are arranged from left to right in the order of RX15, RX14, RX13, RX12, RX11, RX10, RX9, and RX8 in a second row.

In the meantime, the touch sensor includes the plurality of driving electrodes TX, and for example, the plurality of driving electrodes TX may include a $0^{th}$ driving electrode TX0 to a third driving electrode TX3. Herein, each driving electrode may be disposed to satisfy the following arrangement condition.

The plurality of driving electrodes TX is arranged to satisfy the following conditions. 1) One driving electrode is disposed at each of the left side and the right side with respect to two different receiving electrodes RX0 and RX15 consecutive in the column direction. 2) Two facing driving electrodes TX0 and TX0 with respect to the two different receiving electrodes RX0 and RX15 consecutive in the column direction have the same number. 3) The driving electrodes TX arranged in the column direction have the different numbers, and the driving electrodes TX arranged in the row direction have the same number. 4) A length (horizontal length) of the driving electrodes arranged at both edges of each set may be half the length (horizontal length) of the other driving electrodes, but the present invention is not limited thereto, and the lengths may also be the same.

Figures 11A, 11B:
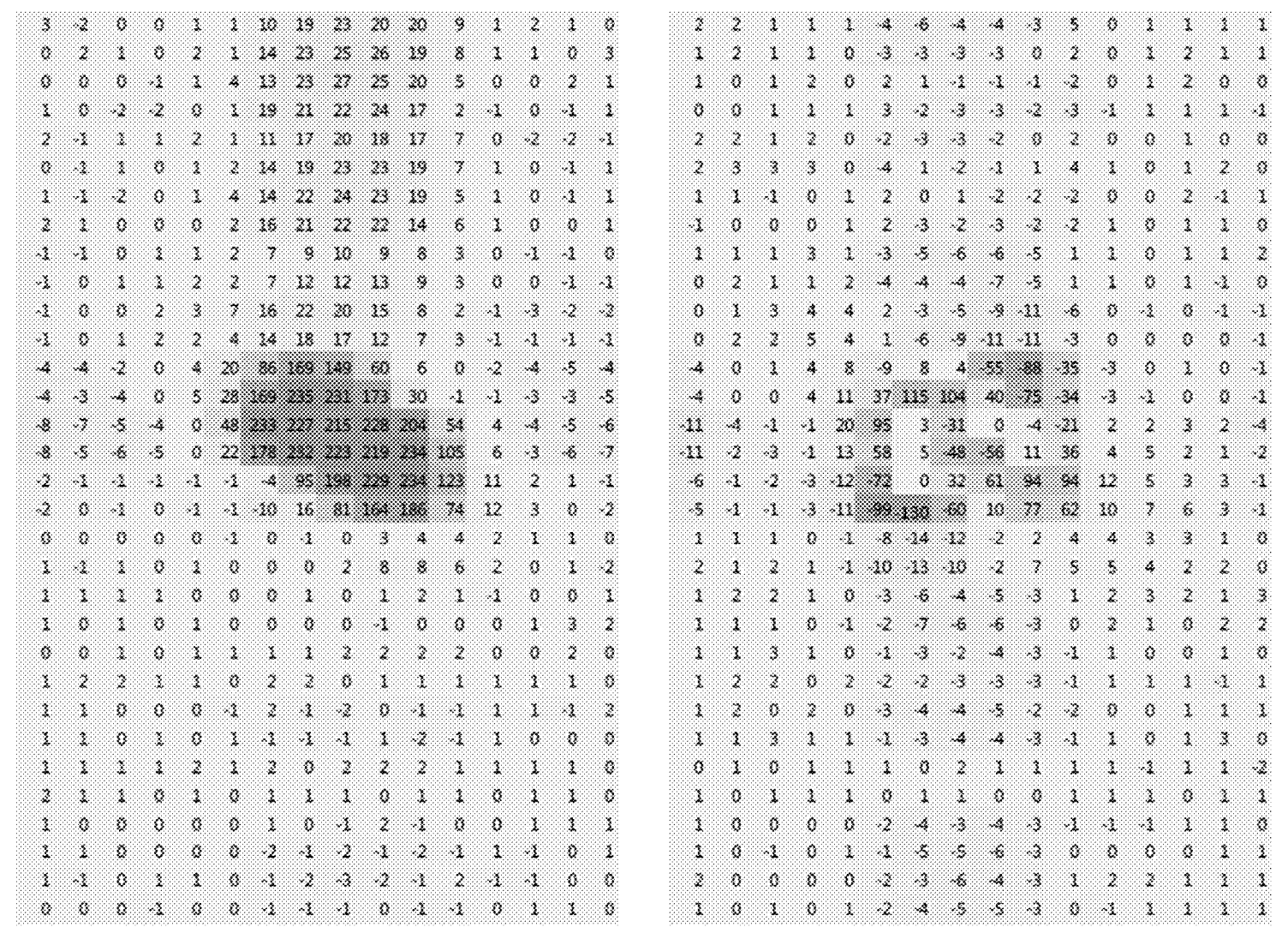

FIGS. 11A-B represent raw data output in a touch input device when an object, such as a thumb, is in contact with a specific portion of a touch surface of a touch input device having a structure of a touch sensor illustrated in FIG. 10.

In particular, FIG. 11A is raw data output in the state where the touch input device having the structure of the touch sensor illustrated in FIG. 10 is gripped, and FIG. 11B is raw data output in the state where the touch input device having the structure of the touch sensor illustrated in FIG. 10 is in a floating state.

The raw data of FIGS. 11A-B may be data derived through a following remap process. When the driving signal is sequentially applied to the plurality of driving electrodes of the touch sensor illustrated in FIG. 10, a predetermined detection signal is output from each of the plurality of receiving electrodes. The output detection signal is converted to a digital value (or signal level value) corresponding to the corresponding detection signal in the detection unit 11 illustrated in FIG. 1 and is output. Further, the detection unit 11 illustrated in FIG. 1 performs mapping so that the output digital values correspond to the respective locations of the touch surface of the touch input device. Through the mapping process, the raw data of FIGS. 11A-B may be output.

The numbers indicated in the raw data of FIGS. 11A-B may be expressed with integers, and when the corresponding integer is equal to or larger than a predetermined reference integer value (for example, +65), the touch detection unit of the touch input device may determine (or recognize) that the touch is input by the object to the part where the corresponding number is located.

Referring to FIG. 11A, in the grip state (normal situation), data values distributed in the middle part of the raw data have relatively larger integer values than other parts. In the meantime, referring to FIG. 11B, in the floating state, the digital values described in the middle part show a different aspect from FIG. 11A. In particular, the middle part generally includes the relatively low integer value compared to FIG. 11A, and even some parts of the middle part have negative values. This is due to the LGM jamming signal generated in the floating state, and as a result of this result, the touch input device may erroneously recognize that two touches, not one touch, are input to the middle part, and may also erroneously recognize that no touch is input in the middle part.

Figure 12:
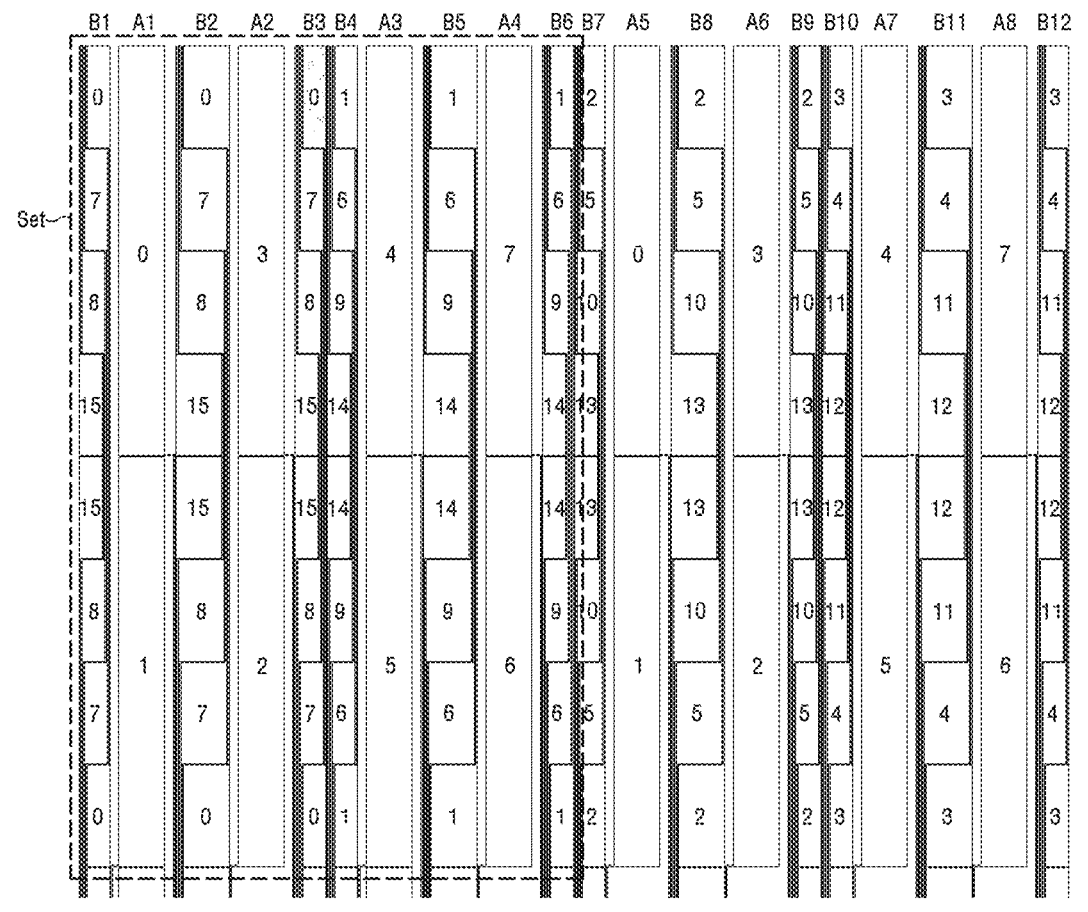

FIG. 12 is a diagram illustrating another example in which the touch sensor 10 illustrated in FIG. 1 is formed in a single layer (one layer), and is an enlarged diagram of only a part.

Referring to FIG. 12, the touch sensor includes the plurality of driving electrodes TX and the plurality of receiving electrodes RX. The plurality of driving electrodes TX and the plurality of receiving electrodes RX are arranged on the same layer in a matrix form.

The plurality of driving electrodes TX and the plurality of receiving electrodes RX may be made of a transparent conductive material (for example, indium tin oxide (ITO) or antimony tin oxide (ATO) made of tin oxide ($SnO_2$) and indium oxide ($In_2O_3$)) and the like. However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT).

Further, the driving electrode TX and the receiving electrode RX may be implemented with a metal mesh. When the driving electrode TX and the receiving electrode RX are implemented with the metal mesh, the wires connected to the driving electrode TX and the receiving electrode RX may also be implemented with the metal mesh, and the driving electrode TX and the receiving electrode RX and the wires may also be integrally implemented with the metal mesh. When the driving electrode TX, the receiving electrode RX, and the wires are integrally implemented with the metal mesh, a dead zone, such as a space between the electrode and the wire and/or a space between the electrode and another electrode, in which a touch position is not detected, is reduced, so that sensitivity of detecting a touch position may be further improved.

The touch sensor is arranged with respect to the plurality of receiving electrodes RX. Accordingly, the arrangement structure of the plurality of receiving electrodes RX will be described first, and the arrangement structure of the plurality of driving electrodes TX will be described.

The plurality of receiving electrodes RX is arranged in each of the plurality of columns A1, A2, A3, A4, A5, A6, A7, and A8. Herein, the plurality of driving electrodes TX is arranged in the plurality of columns B1, B2, B3, B4, B5, B6, B7, B8, B9, B10, B11, and B12 formed between the plurality of columns A1, A2, A3, A4, A5, A6, A7, and A8, in which the plurality of receiving electrodes RX is arranged, at the external side of the first column A1, and at the external side of the eighth column A8.

With respect to each receiving electrode RX of the plurality of receiving electrodes RX, the two driving electrodes TX adjacent to both sides have the same characteristic. That is, the two driving electrodes TX adjacent to both sides with respect to each receiving electrode RX have the same number. Herein, the meaning that the two driving electrodes TX are the same or that the numbers of the two driving electrodes TX are the same is that the two driving electrodes TX are electrically connected through wires.

The touch sensor includes one or more sets in which the plurality of receiving electrodes RX and the plurality of driving electrodes TX are disposed in a predetermined arrangement. The plurality of sets is repeatedly arranged in the row direction and the column direction to configure the touch sensor.

One set may include the plurality of different receiving electrodes RX, and for example, one set may include 8 receiving electrodes including a $0^{th}$ receiving electrode RX0 to a seventh receiving electrode RX7. The eight receiving electrodes RX0, RX1, RX2, RX3, RX4, RX5, RX6, and RX7 may be disposed in a predetermined arrangement. The eight receiving electrodes of the $0^{th}$ receiving electrode RX0 to the eighth receiving electrode RX are divided and arranged in the four columns A1, A2, A3, and A4 consecutive in the row direction. Accordingly, in each of the four columns, the two receiving electrodes may be disposed from top to bottom.

The plurality of receiving electrodes having the consecutive numbers is disposed in each column. Herein, the arrangement order of the odd-numbered columns A1 and A3 and the arrangement order of the even-numbered columns A2 and A4 may be opposite to each other. For example, the receiving electrodes RX0 and RX1 having the consecutive numbers are sequentially arranged from top to bottom in the first column A1, the receiving electrodes RX2 and RX3 having the consecutive numbers are sequentially arranged from bottom to top in the second column A2, the receiving electrodes RX4 and RX5 having the consecutive numbers are sequentially arranged from top to bottom in the third column A3, and the receiving electrodes RX6 and RX7 having the consecutive numbers are sequentially arranged from bottom to top in the fourth column A4. Herein, although not illustrated in the drawing, the plurality of different receiving electrodes included in one set may not be sequentially arranged in the row or column direction, but may be arranged randomly.

In the meantime, the touch sensor includes the plurality of driving electrodes TX, and for example, the plurality of driving electrodes TX may include a $0^{th}$ driving electrode TX0 to a fifteenth driving electrode TX15. Herein, each driving electrode may be disposed to satisfy the following arrangement condition.

The plurality of driving electrodes TX is arranged to satisfy the following conditions. 1) With respect to one receiving electrode RX, four different driving electrodes are arranged at the left side, and four different driving electrodes are arranged at the right side. 2) With respect to each receiving electrode RX, two facing driving electrodes TX have the same number. 3) Three driving electrodes having the same number are consecutively arranged in the row direction. 4) Eight driving electrodes adjacent to the receiving electrode RX1 in the even-numbered row are arranged to be symmetric to eight driving electrodes adjacent to the receiving electrode RX0 in the odd-numbered row. 5) A length (horizontal length) of the driving electrodes TX arranged at both edges of each set and the driving electrodes arranged at the center of each set is half the length (horizontal length) of the other driving electrodes.

Figure 13:
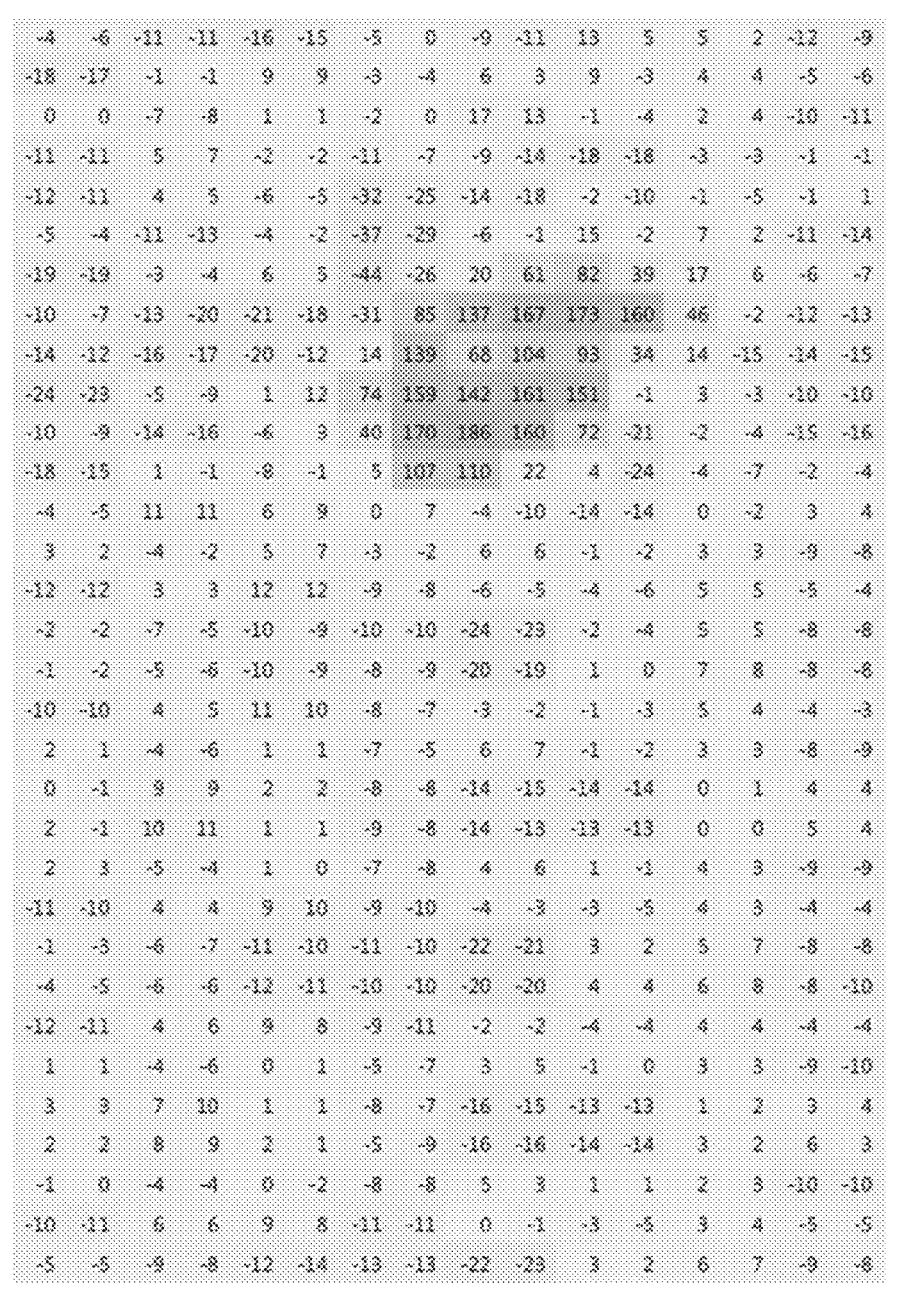

FIG. 13 represents raw data when an object, such as a thumb, is in contact with a specific portion of the touch surface of the touch input device having the structure of the touch sensor illustrated in FIG. 12. In particular, FIG. 13 represents raw data in the state where the touch input device having the structure of the touch sensor illustrated in FIG. 12 is in a floating state.

Referring to FIG. 13, it is confirmed that in the floating state, digital values (or level values) output in a specific part of the raw data have relatively larger integer values than other parts.

When the raw data illustrated in FIG. 13 is compared with the raw data illustrated in FIG. 11B, it can be seen that in the floating state, the structure of the touch sensor illustrated in FIG. 12 has a more LGM improvement effect than the structure of the touch sensor illustrated in FIG. 10.

FIG. 14 is a graph representing a rough comparison of LGM performance between the touch sensors illustrated in FIGS. 10 and 12.

Referring to FIG. 14, in the touch sensor illustrated in FIG. 10, in the grip state, the relatively large level values among the level values in the touch area have values of about +250, but in the floating state, the relatively large values have values between −100 to +100.

In the meantime, the touch sensor illustrated in FIG. 12, in the grip state, the relatively large level values among the level values in the touch area have level values of about +250, but in the floating state, the relatively large values have values between +70 to +170.

According to the graph of FIG. 14, the touch input device including the touch sensor illustrated in FIG. 10 is difficult to accurately recognize whether a touch is input and a touch position in the floating state, but in the touch input device including the touch sensor illustrated in FIG. 12, the relatively large level values are +70 or more even in the floating state, so that the touch input device does not have a problem in recognizing whether a touch is input and a touch position. However, the output of the relatively large level values (+250) like the grip state or the output of the values similar to the relatively large level values (+250) in the grip state even in the floating state is very important for the touch input device to accurately recognize whether a touch is input and/or a touch position.

Hereinafter, the touch sensor capable of outputting (floating (final data)) a signal level value output in a floating state of the touch input devices including the touch sensor of FIGS. 9 and 10 and the touch sensor of the dual layers (two layers) illustrated in FIGS. 2 and 3, as well as the touch sensor (one layer) of FIG. 12 to be the same as or similar to a signal level value output in a grip state of the touch input device, and the touch input devices including the same will be described with reference to the drawings in detail.

The touch sensor of the single layer structure or the dual-layer structure may also be applied to any one of FIGS. 4A-F. That is, the method to be described below may be applied to the touch sensors having all currently known structures and touch input devices including the same. Further, although not illustrated in a separate drawing, one of the plurality of driving electrodes and the plurality of receiving electrodes in the touch sensor of the dual-layer structure may be disposed between the touch surface and the display panel, and the other one may be disposed inside the display panel.

Further, the exemplary embodiment of the present invention is not applied only to the touch input devices including the touch sensors illustrated in FIGS. 2, 3, 9, 10, and 12, and may also be applied to the touch input device including the touch sensor of another single layer structure or dual-layer structure which is not illustrated in the present specification. As another specific example, the exemplary embodiment of the present invention may also be applied to the touch input devices including the touch sensor illustrated in FIGS. 15 and 16.

Figure 15:
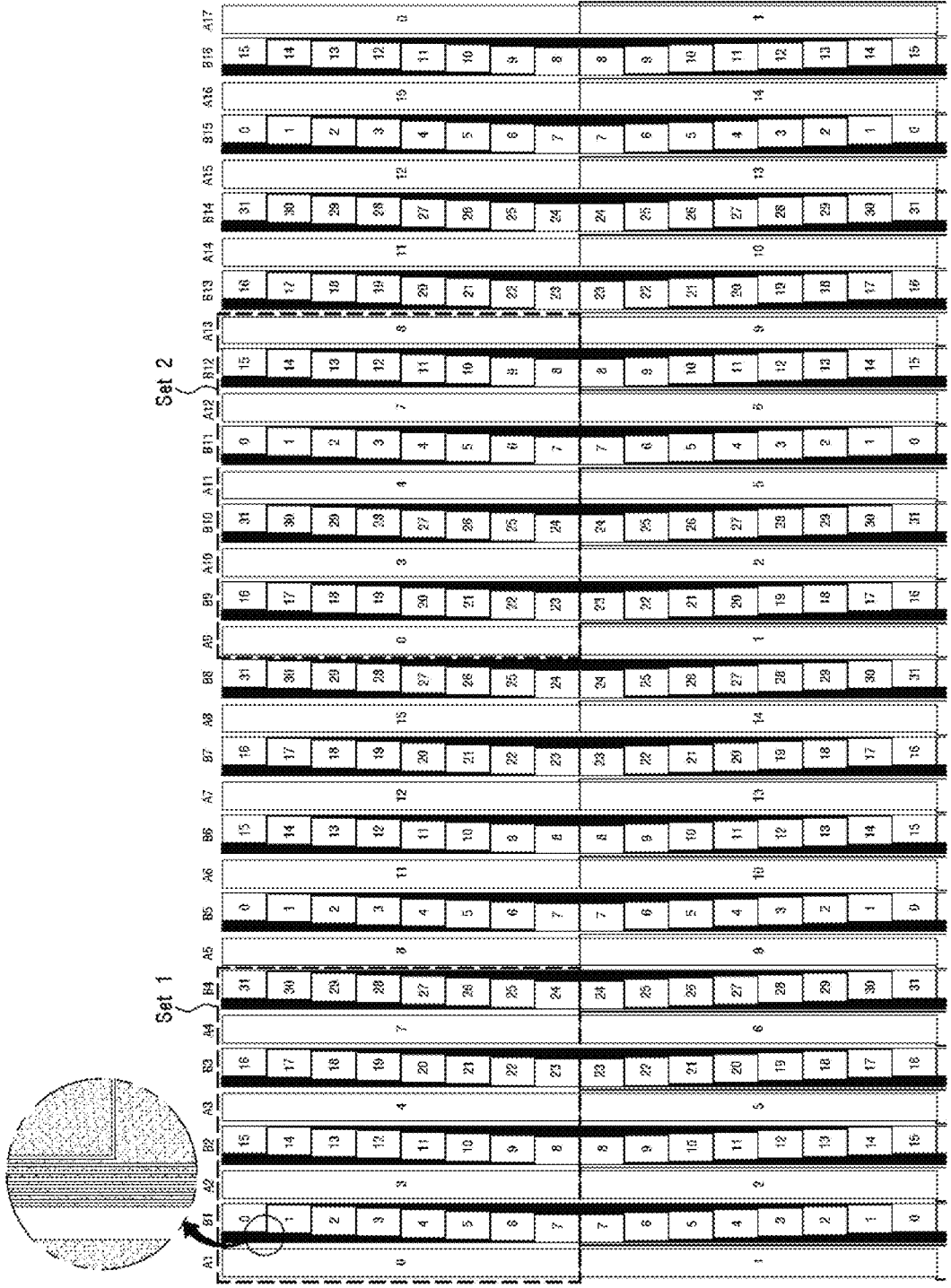
FIG. 15 is a diagram illustrating another example in which the touch sensor 10 illustrated in FIG. 1 is formed in a single layer (one layer), and is an enlarged diagram of only a part.

FIG. 15 is a diagram illustrating another example in which the touch sensor 10 illustrated in FIG. 1 is formed in a single layer (one layer), and is an enlarged diagram of only a part.

Referring to FIG. 15, the touch sensor according to the exemplary embodiment includes the plurality of driving electrodes TX and the plurality of receiving electrodes RX. The plurality of driving electrodes TX and the plurality of receiving electrodes RX are arranged in a matrix form.

The plurality of driving electrodes TX and the plurality of receiving electrodes RX may be made of a transparent conductive material (for example, indium tin oxide (ITO) or antimony tin oxide (ATO) made of tin oxide ($SnO_2$) and indium oxide ($In_2O_3$)) and the like. However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT).

Further, the driving electrode TX and the receiving electrode RX may be implemented with a metal mesh. When the driving electrode TX and the receiving electrode RX are implemented with the metal mesh, the wires connected to the driving electrode TX and the receiving electrode RX may also be implemented with the metal mesh, and the driving electrode TX and the receiving electrode RX and the wires may also be integrally implemented with the metal mesh. When the driving electrode TX, the receiving electrode RX, and the wires are integrally implemented with the metal mesh, a dead zone, such as a space between the electrode and the wire and/or a space between the electrode and another electrode, in which a touch position is not detected, is reduced, so that sensitivity of detecting a touch position may be further improved.

The touch sensor according to the exemplary embodiment is arranged with respect to the plurality of driving electrodes TX. Accordingly, hereinafter, the arrangement structure of the driving electrodes TX disposed in columns B1 to B16 will be first described, and then the arrangement structure of the plurality of receiving electrodes RX will be described.

The plurality of driving electrodes TX is arranged in each of the plurality of columns B1, B2, B3, B4, B5, B6, B7, B8, B9, B10, B11, B12, B13, B14, B15, and B16. Herein, the plurality of receiving electrodes RX is arranged in the plurality of columns A1, A2, A3, A4, A5, A6, A7, A8, A9, A10, A11, A12, A13, A14, A15, A16 formed between the plurality of columns B1, B2, B3, B4, B5, B6, B7, B8, B9, B10, B11, B12, B13, B14, B15, and B16, in which the driving electrodes TX is arranged, at the external side of the first column B1, and at the external side of the $16^{th}$ column B16.

With respect to each driving electrode TX of the plurality of driving electrodes TX, the two receiving electrodes RX adjacent to both sides have the different characteristic. That is, the two receiving electrodes RX adjacent to both sides with respect to each driving electrode TX have the different number. Herein, the meaning that the two receiving electrodes RX are different or the two receiving electrodes RX have different numbers is that the receiving electrodes are not electrically connected through wires.

The plurality of driving electrodes TX includes a first set set 1 in which 32 driving electrodes including the $0^{th}$ driving electrode TX0 to the $31^{st}$ driving electrode TX31 are disposed in a first arrangement, and a second set set 2 in which the 32 driving electrodes including the $0^{th}$ driving electrode TX0 to the $31^{st}$ driving electrode TX31 are disposed in a second arrangement.

The first set set 1 may be provided with two consecutively in the row direction and two in the column direction, and the first set set 1 located in the even-numbered row may be symmetric to the first set set 1 located in the odd-numbered row.

The second set set 2 may be provided with two consecutively in the row direction and two in the column direction, and the second set set 2 located in the even-numbered row may be symmetric to the second set set 2 located in the odd-numbered row.

Further, the plurality of second sets may be disposed at one side of the plurality of first sets.

In the first arrangement of the first set set 1, the 32 driving electrodes including the 0th driving electrode TX0 to the $31^{st}$ driving electrode TX31 are divided and arranged in four columns consecutively in the row direction, and in the first column, the driving electrodes numbered from 0 to 7 are arranged from top to bottom in the order of TX0, TX1, TX2, TX3, TX4, TX5, TX6, and TX7, in the second column, the driving electrodes numbered from 8 to 15 are arranged from top to bottom in the order of TX15, TX14, TX13, TX12, TX11, TX10, TX9, and TX8, in the third column, the driving electrodes numbered from 16 to 23 are arranged from top to bottom in the order of TX16, TX17, TX18, TX19, TX20, TX21, TX22, and TX23, and in the fourth column, the driving electrodes numbered from 24 to 31 are arranged from top to bottom in the order of TX31, TX30, TX29, TX28, TX27, TX26, TX25, and TX24.

In the second arrangement of the second set set 2, the 32 driving electrodes including the $0^{th}$ driving electrode TX0 to the $31^{st}$ driving electrode TX31 are divided and arranged in four columns consecutively in the row direction, and in the first column, the driving electrodes numbered from 16 to 23 are arranged from top to bottom in the order of TX16, TX17, TX18, TX19, TX20, TX21, TX22, and TX23, in the second column, the driving electrodes numbered from 24 to 31 are arranged from top to bottom in the order of TX31, TX30, TX29, TX28, TX27, TX26, TX25, and TX24, in the third column, the driving electrodes numbered from 0 to 7 are arranged from top to bottom in the order of TX0, TX1, TX2, TX3, TX4, TX5, TX6, and TX7, and in the fourth column, the driving electrodes numbered from 8 to 15 are arranged from top to bottom in the order of TX15, TX14, TX13, TX12, TX11, TX10, TX9, and TX8.

In the meantime, the touch sensor according to the exemplary embodiment includes the plurality of receiving electrodes RX, and for example, the plurality of receiving electrodes RX may include a $0^{th}$ receiving electrode RX0 to a $15^{th}$ receiving electrode RX15. Herein, each receiving electrode may be disposed so as to satisfy the following arrangement condition.

The plurality of receiving electrodes RX are disposed so as to satisfy the following conditions. 1) With respect to the eight different driving electrodes TX consecutive in the column direction, one receiving electrode is disposed at the left side and one receiving electrode is disposed at the right side. 2) With respect to the eight different driving electrodes TX consecutive in the column direction, two facing receiving electrodes RX have different numbers. 3) Two different receiving electrodes RX are arranged in the column direction, and eight different receiving electrodes RX are repeatedly arranged in the row direction. 4) A length (horizontal length) of the receiving electrodes arranged at both edges in the column direction may be the same as the length (horizontal length) of the other receiving electrodes, but is not limited thereto, and a length (horizontal length) of the receiving electrodes arranged at both edges in the column direction may be half the length (horizontal length) of the other receiving electrodes.

Figure 16:
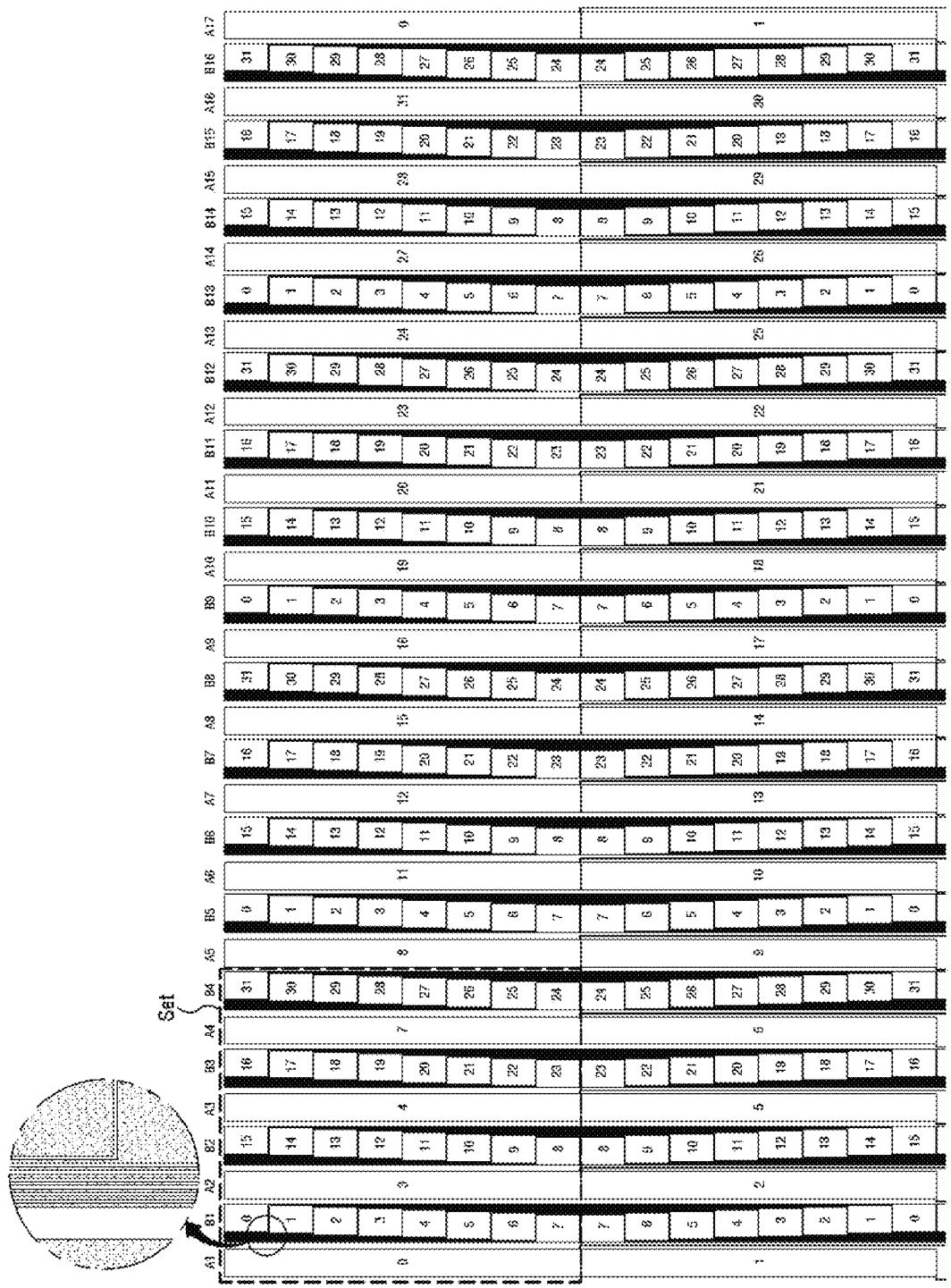
FIG. 16 is a diagram illustrating another example in which the touch sensor 10 illustrated in FIG. 1 is formed in a single layer (one layer), and is an enlarged diagram of only a part.

FIG. 16 is a diagram illustrating another example in which the touch sensor 10 illustrated in FIG. 1 is formed in a single layer (one layer), and is an enlarged diagram of only a part.

Referring to FIG. 16, the touch sensor according to the exemplary embodiment includes the plurality of driving electrodes TX and the plurality of receiving electrodes RX. The plurality of driving electrodes TX and the plurality of receiving electrodes RX are arranged in a matrix form.

The plurality of driving electrodes TX and the plurality of receiving electrodes RX may be made of a transparent conductive material (for example, indium tin oxide (ITO) or antimony tin oxide (ATO) made of tin oxide ($SnO_2$) and indium oxide ($In_2O_3$)) and the like. However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT).

Further, the driving electrode TX and the receiving electrode RX may be implemented with a metal mesh. When the driving electrode TX and the receiving electrode RX are implemented with the metal mesh, the wires connected to the driving electrode TX and the receiving electrode RX may also be implemented with the metal mesh, and the driving electrode TX and the receiving electrode RX and the wires may also be integrally implemented with the metal mesh. When the driving electrode TX, the receiving electrode RX, and the wires are integrally implemented with the metal mesh, a dead zone, such as a space between the electrode and the wire and/or a space between the electrode and another electrode, in which a touch position is not detected, is reduced, so that sensitivity of detecting a touch position may be further improved.

The touch sensor according to the exemplary embodiment is arranged with respect to the plurality of driving electrodes TX. Accordingly, hereinafter, the arrangement structure of the driving electrodes TX disposed in columns B1 to B16 will be first described, and then the arrangement structure of the plurality of receiving electrodes RX will be described.

The plurality of driving electrodes TX is arranged in each of the plurality of columns B1, B2, B3, B4, B5, B6, B7, B8, B9, B10, B11, B12, B13, B14, B15, and B16. Herein, the plurality of receiving electrodes RX is arranged in the plurality of columns A1, A2, A3, A4, A5, A6, A7, A8, A9, A10, A11, A12, A13, A14, A15, A16 formed between the plurality of columns B1, B2, B3, B4, B5, B6, B7, B8, B9, B10, B11, B12, B13, B14, B15, and B16, in which the driving electrodes TX is arranged, at the external side of the first column B1, and at the external side of the 16$^{th}$ column B16.

With respect to each driving electrode TX of the plurality of driving electrodes TX, the two receiving electrodes RX adjacent to both sides have the different characteristic. That is, the two receiving electrodes RX adjacent to both sides with respect to each driving electrode TX have the different number. Herein, the meaning that the two receiving electrodes RX are different or the two receiving electrodes RX have different numbers is that the receiving electrodes are not electrically connected through wires.

The plurality of driving electrodes TX includes a set in which 32 driving electrodes including a 0$^{th}$ driving electrode TX0 to a 31$^{st}$ driving electrode TX31 are disposed in a first arrangement. Herein, the set may be repeatedly arranged in plural in the row direction and the column direction. The set located in the even-numbered row may be symmetric to the set located in the odd-numbered row.

In the first arrangement of the first set set 1, the 32 driving electrodes including the 0th driving electrode TX0 to the 31$^{st}$ driving electrode TX31 are arranged in four columns consecutively in the row direction, and in the first column, the driving electrodes numbered from 0 to 7 are arranged from top to bottom in the order of TX0, TX1, TX2, TX3, TX4, TX5, TX6, and TX7, in the second column, the driving electrodes numbered from 8 to 15 are arranged from top to bottom in the order of TX15, TX14, TX13, TX12, TX11, TX10, TX9, and TX8, in the third column, the driving electrodes numbered from 16 to 23 are arranged from top to bottom in the order of TX16, TX17, TX18, TX19, TX20, TX21, TX22, and TX23, and in the fourth column, the driving electrodes numbered from 24 to 31 are arranged from top to bottom in the order of TX31, TX30, TX29, TX28, TX27, TX26, TX25, and TX24.

In the meantime, the touch sensor according to the exemplary embodiment includes the plurality of receiving electrodes RX, and for example, the plurality of receiving electrodes RX may include a 0$^{th}$ receiving electrode RX0 to a 31$^{st}$ receiving electrode RX31. Herein, each receiving electrode may be disposed so as to satisfy the following condition.

The plurality of receiving electrodes RX are disposed so as to satisfy the following arrangement condition. 1) With respect to the eight different driving electrodes TX consecutive in the column direction, one receiving electrode is disposed at the left side and one receiving electrode is disposed at the right side. 2) With respect to the eight different driving electrodes TX consecutive in the column direction, two facing receiving electrodes RX have different numbers. 3) Two different receiving electrodes are arranged in the column direction, and 16 different receiving electrodes are repeatedly arranged in the row direction. 4) A length (horizontal length) of the receiving electrodes arranged at both edges in the column direction may be the same as the length (horizontal length) of the other receiving electrodes, but is not limited thereto, and a length (horizontal length) of the receiving electrodes arranged at both edges in the column direction may be half the length (horizontal length) of the other receiving electrodes.

FIG. 17 is one exemplary conceptual diagram in which the touch sensor according to the exemplary embodiment of the present invention is conceptualized.

Referring to FIG. 17, the touch sensor according to the exemplary embodiment of the present invention includes the plurality of driving electrodes TX0 to TX7 and the plurality of receiving electrodes RX0 to RX7. Herein, the plurality of driving electrodes TX0 to TX7 and the plurality of receiving electrodes RX0 to RX7 may be formed on the single layer as illustrated in FIG. 10 or 12, and may be formed on the dual layers as illustrated in FIG. 2 or 3.

The touch sensor according to the exemplary embodiment of the present invention including the plurality of driving electrodes TX0 to TX7 and the plurality of receiving electrodes RX0 to RX7 includes nodes that form mutual capacitance (Cm) between the plurality of driving electrodes TX0 to TX7 and the plurality of receiving electrodes RX0 to RX7 and nodes that do not form mutual capacitance (Cm).

For example, in FIG. 17, the nodes that form mutual capacitance (Cm) are (Tx0, Rx0), (Tx0, Rx1), (Tx0, Rx2), (Tx0, Rx3), (Tx1, Rx4), (Tx1, Rx5), (Tx1, Rx6), (Tx1, Rx7), (Tx2, Rx0), (Tx2, Rx1), (Tx2, Rx2), (Tx2, Rx3), (Tx3, Rx4), (Tx3, Rx5), (Tx3, Rx6), (Tx3, Rx7), (Tx4, Rx0), (Tx4, Rx1), (Tx4, Rx2), (Tx4, Rx3), (Tx5, Rx4), (Tx5, Rx5), (Tx5, Rx6), (Tx5, Rx7), (Tx6, Rx0), (Tx6, Rx1), (Tx6, Rx2), (Tx6, Rx3), (Tx7, Rx4), (Tx7, Rx5), (Tx7, Rx6), and (Tx7, Rx7).

The respective receiving electrodes Rx of the nodes that form mutual capacitance (Cm) may be named as active receiving electrodes Rx.

The detection signal output from the receiving electrode Rx of each of the nodes that form mutual capacitance (Cm) include noise information, as well as information about the amount of capacitance changed by a touch of the object. Herein, the noise information includes display noise (for example, Zebra noise) information, information about the amount of change according to the change in an image displayed on the display panel, and information on the amount of negative (−) capacitance changed by an LGM jamming signal generated in a floating state. Accordingly, when the detection signals received from the respective receiving electrodes RX of the nodes that form mutual capacitance (Cm) are converted into predetermined level values and output, the information on the amount of mutual capacitance changed and the noise information are reflected to the output level value.

In the meantime, in FIG. 17, the nodes that do not form mutual capacitance (Cm) are Tx0, Rx4), (Tx0, Rx5), (Tx0, Rx6), (Tx0, Rx7), (Tx1, Rx0), (Tx1, Rx1), (Tx1, Rx2), (Tx1, Rx3), (Tx2, Rx4), (Tx2, Rx5), (Tx2, Rx6), (Tx2, Rx7), (Tx3, Rx0), (Tx3, Rx1), (Tx3, Rx2), (Tx3, Rx3), (Tx4, Rx4), (Tx4, Rx5), (Tx4, Rx6), (Tx4, Rx7), (Tx5, Rx0), (Tx5, Rx1), (Tx5, Rx2), (Tx5, Rx3), (Tx6, Rx4), (Tx6, Rx5), (Tx6, Rx6), (Tx6, Rx7), (Tx7, Rx0), (Tx7, Rx1), (Tx7, Rx2), and (Tx7, Rx3).

The respective receiving electrodes Rx of the nodes that do form mutual capacitance (Cm) may be named as dummy receiving electrodes Rx. The dummy receiving electrode may be the configuration independently of the plurality of receiving electrodes within the touch sensor, and some receiving electrodes among the plurality of receiving electrodes may also be used as the dummy receiving electrodes in a specific situation and condition.

The detection signal output from the receiving electrode RX of each of the nodes that do form mutual capacitance (Cm) does not include information about the amount of capacitance changed by a touch of the object, but includes only noise information.

Accordingly, the touch input device according to the exemplary embodiment of the present invention including the touch sensor may remove the noise information and obtain the information on the amount of capacitance changed by the touch of the object by subtracting a detection signal (a second signal) output from the receiving electrode Rx of each of the nodes that do not form mutual capacitance (Cm) from a detection signal (a first signal) output from the receiving electrode Rx of each of the nodes that form mutual capacitance (Cm). A digital value (or a signal level value) corresponding to a final detection signal obtained by subtracting, by the touch input device, the detection signal output from the receiving electrode Rx of each of the nodes that do not form mutual capacitance (Cm) from the detection signal output from the receiving electrode Rx of each of the nodes that form mutual capacitance (Cm) is the value based on the information on the amount of capacitance changed by the touch of the object. As a result, even though the touch input device is in the floating state, the digital value that is the same as or almost similar to the digital value output from the state where the touch input device is in the grip state may be output.

Herein, more preferably, the touch input device according to the exemplary embodiment of the present invention may subtract a value obtained by multiplying a detection signal (a second detection signal) output from the receiving electrode Rx of each of the nodes that do not form mutual capacitance (Cm) and a predetermined factor from a detection signal (a first detection signal) output from the receiving electrode Rx of each of the nodes that form mutual capacitance (Cm). The reason why the factor is multiplied with the second detection signal is to compensate for a change in a size of the detection signal incurable due to the difference in the configuration between an active channel and a dummy channel. For example, the factor may have a predetermined value, such as 0.8, but is not limited thereto, and the value of the factor may be changed depending on a design.

Hereinafter, a particular example will be described with reference to FIGS. 18 to 24.

FIG. 18 is a conceptual diagram in which a touch sensor according to an exemplary embodiment of the present invention illustrated in FIG. 12 is conceptualized.

Referring to FIG. 18, the touch sensor according to the exemplary embodiment of the present invention includes the plurality of driving electrodes TX0 to TX7 and the plurality of receiving electrodes RX0 to RX7. At least a part of the plurality of receiving electrodes RX0 to RX7 is used as dummy receiving electrodes Rx. Herein, the receiving electrodes among the plurality of receiving electrodes RX0 to RX7 used as the dummy receiving electrodes are determined according to the driving electrode to which the driving signal is applied.

For example, when the driving signal is applied to the $0^{th}$ driving electrode TX0, the fourth receiving electrode Rx4, the fifth receiving electrode Rx5, the sixth receiving electrode Rx6, and the seventh receiving electrode Rx7 among the plurality of receiving electrodes Rx0 to Rx7 are used as the dummy receiving electrodes. That is, when the driving signal is applied to the $0^{th}$ driving electrode TX0, the fourth, fifth, sixth, and seventh receiving electrodes Rx4, Rx5, Rx6, and Rx7 are the receiving electrodes that do not form the mutual capacitance (Cm) with the $0^{th}$ driving electrode Tx0, and the $0^{th}$, first, second, and third receiving electrodes Rx0, Rx1, Rx2, and Rx3 are the receiving electrodes that form the mutual capacitance (Cm) with the 0th driving electrode Tx0.

When the driving signal is applied to the first driving electrode Tx1, the fourth, fifth, sixth, and seventh receiving electrodes Rx4, Rx5, Rx6, and Rx7 are the receiving electrodes that form the mutual capacitance (Cm) with the first driving electrode Tx1, and the $0^{th}$, first, second, and third receiving electrodes Rx0, Rx1, Rx2, and Rx3 are the receiving electrodes that do not form the mutual capacitance (Cm) with the first driving electrode Tx1.

The touch input device according to the exemplary embodiment of the present invention including the touch sensor may remove the noise information, particularly, the information on the amount of negative (−) capacitance changed by the LGM jamming signal by subtracting a detection signal output from the receiving electrode Rx of each of the nodes that do not form mutual capacitance (Cm) from a detection signal output from the receiving electrode Rx of each of the nodes that form mutual capacitance (Cm). Herein, the touch input device according to the exemplary embodiment of the present invention including the touch sensor may subtract a value obtained by multiplying a detection signal output from the receiving electrode Rx of each of the nodes that do not form mutual capacitance (Cm) and a predetermined factor from a detection signal output from the receiving electrode Rx of each of the nodes that form mutual capacitance (Cm).

FIG. 19 is a diagram illustrating an example for describing electrodes used as dummy receiving electrodes among the plurality of receiving electrodes of the touch sensor illustrated in FIG. 12.

Referring to FIG. 19, when the driving signal is applied to the first driving electrode Tx1, the fourth, fifth, sixth, and seventh receiving electrodes Rx4, Rx5, Rx6, and Rx7 are the receiving electrodes Active Rx that form the mutual capacitance (Cm) with the first driving electrode Tx1, and the $0^{th}$, first, second, and third receiving electrodes Rx0, Rx1, Rx2, and Rx3 are the dummy receiving electrodes Dummy Rx that do not form the mutual capacitance (Cm) with the first driving electrode Tx1.

The detection signals output from the active receiving electrodes Rx4, Rx5, Rx6, Rx7 include noise information, as well as the information on the amount of capacitance changed by the touch of the object. Herein, the noise information includes display noise (for example, Zebra noise), information about the amount of change according to the change in an image displayed on the display panel, and information on the amount of negative (−) capacitance changed by an LGM jamming signal generated in a floating state. Accordingly, when the touch detection unit of the touch input device converts the detection signals output from the active receiving electrodes Rx4, Rx5, Rx6, and Rx7 into predetermined level values and outputs the converted level value, the information on the amount of mutual capacitance changed and the noise information are reflected to the output level value.

On the other hand, the detection signal output from the dummy receiving electrodes Rx0, Rx1, Rx2, and Rx3 includes little information on the amount of capacitance changed by the touch of the object, but includes only the noise information.

Figure 20C:
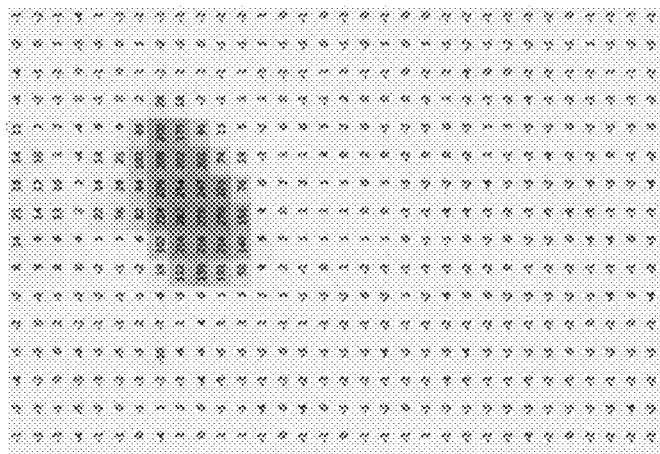
FIGS. 20A-C are diagrams illustrating an example of raw data output in a touch input device including a touch sensor according to an exemplary embodiment of the present invention illustrated in FIG. 12.
Figure 20B:
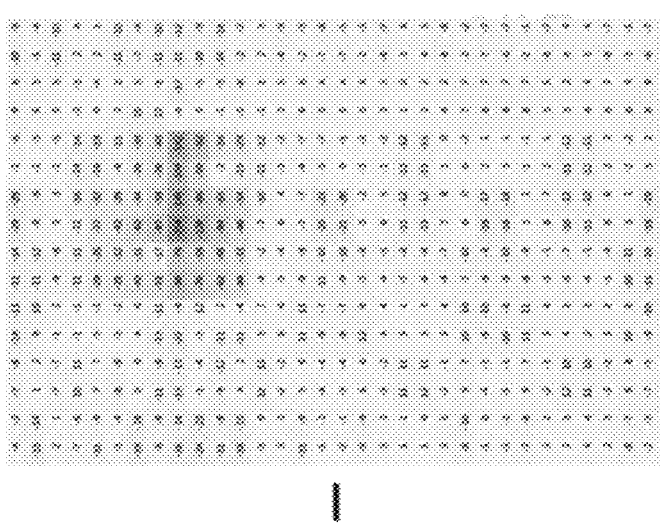
Figure 20A:

FIGS. 20A-C are diagrams illustrating an example of raw data output in the touch input device including the touch sensor according to the exemplary embodiment of the present invention illustrated in FIG. 12.

The raw data illustrated in FIG. 20A is the same as the raw data illustrated in FIG. 13. That is, the raw data illustrated in FIG. 13 is the raw data based on the detection signal output from the receiving electrode (active Rx) of each of the nodes that form mutual capacitance (Cm) in the touch sensor illustrated in FIG. 12, and FIG. 20B is the raw data based on the detection signal output from the receiving electrode (dummy Rx) of each of the nodes that do not form mutual capacitance (Cm) in the touch sensor illustrated in FIG. 12.

FIG. 20C is the raw data when the detection signal output from the receiving electrode (dummy Rx) of each of the nodes that do not form mutual capacitance (Cm) is subtracted from the detection signal output from the receiving electrode (active Rx) of each of the nodes that form mutual capacitance (Cm).

In the comparison between the raw data of FIG. 20C and the raw data of FIG. 20A, it can be seen that the digital values (or level values) within the touch area in which the touch is actually input by the object) in the raw data of FIG. 20C are relatively larger than the digital value (or level value) of the corresponding portion of FIG. 20A. That is, it can be seen that the central portion of the touch area has a level value of about +250 or more, so that it can be confirmed that even in the floating state, the touch input device may obtain the same or similar level values as those in the grip state.

Although the raw data is not separately illustrated, it is expected that the raw data obtained by subtracting a value obtained by multiplying the detection signal output from the receiving electrode (dummy Rx) of each of the nodes that do not form mutual capacitance (Cm) and a predetermined factor from the detection signal output from the receiving electrode (active Rx) of each of the nodes that form mutual capacitance (Cm) is similar to the raw data of FIG. 20C.

FIG. 21 is a conceptual diagram illustrating a touch sensor according to an exemplary embodiment of the present invention having a bridge structure is conceptualized.

Referring to FIG. 21, the touch sensor according to the exemplary embodiment of the present invention includes the plurality of driving electrodes TX0 to TX7 and the plurality of receiving electrodes RX0 to RX3. Further, the touch sensor according to the exemplary embodiment of the present invention includes the plurality of dummy receiving electrodes DRx0 to DRx3.

Mutual capacitance (Cm) is formed between the plurality of driving electrodes TX0 to TX7 and the plurality of receiving electrodes RX0 to RX3, but mutual capacitance (Cm) is not formed between the plurality of driving electrodes TX0 to TX7 and the plurality of dummy receiving electrodes DRx0 to DRx3. Herein, actually, mutual capacitance (Cm) may be marginally formed between the plurality of driving electrodes TX0 to TX7 and the plurality of dummy receiving electrodes DRx0 to DRx3, but the marginal mutual capacitance is ignorable when whether the touch is input is detected.

The touch input device according to the exemplary embodiment of the present invention including the touch sensor may remove the noise information, particularly, the information on the amount of negative (−) capacitance changed by the LGM jamming signal by subtracting a detection signal output from the receiving electrode Rx of each of the nodes that do not form mutual capacitance (Cm) from a detection signal output from the receiving electrode Rx of each of the nodes that form mutual capacitance (Cm). Herein, the touch input device according to the exemplary embodiment of the present invention including the touch sensor may also subtract a value obtained by multiplying a detection signal output from the receiving electrode Rx of each of the nodes that do not form mutual capacitance (Cm) and a predetermined factor from a detection signal output from the receiving electrode Rx of each of the nodes that form mutual capacitance (Cm).

FIG. 22 is a configuration diagram of a touch sensor according to an example to which the conceptual diagram of the touch sensor illustrated in FIG. 21 is applicable.

Referring to FIG. 22, the plurality of driving electrodes Tx0, Tx1, Tx2, and Tx3 is arranged in parallel in the horizontal direction, and the plurality of receiving electrodes Rx0 and Rx1 is arranged in parallel in the vertical direction.

Each of the plurality of driving electrodes Tx0, Tx1, Tx2, and Tx3 and the plurality of receiving electrodes Rx0 and Rx1 has a diamond shape, and the two adjacent driving electrodes and the two adjacent receiving electrodes are electrically connected with each other through a conductive connection unit.

The plurality of driving electrodes Tx0, Tx1, Tx2, and Tx3 and the plurality of receiving electrodes Rx0 and Rx1 may be implemented with a metal mesh. Herein, the conductive connection unit connecting the plurality of driving electrodes Tx0, Tx1, Tx2, and Tx3 may also be implemented with a metal mesh. The conductive connection unit connecting the plurality of driving electrodes Tx0, Tx1, Tx2, and Tx3 may also be implemented with a metal mesh, and may also be implemented in a conductive trace.

Each of the plurality of driving electrodes Tx0, Tx1, Tx2, and Tx3 and the plurality of receiving electrodes Rx0 and Rx1 has an electrically insulated dummy pattern inside thereof. The dummy pattern may be formed in order to reduce base capacitance of each receiving electrode and driving electrode. After the pattern of each driving electrode and the pattern of each receiving electrode are formed of the metal mesh, the dummy pattern may be formed by cutting a part of the metal mesh in each pattern.

In the plurality of dummy receiving electrodes DRx0 and DRx1, the dummy patterns inside the plurality of receiving electrodes Rx0 and Rx1 may be electrically connected. Since the plurality of receiving electrodes Rx0 and Rx1 are very adjacent to the plurality of driving electrodes Tx0, Tx1, Tx2, and Tx3, the mutual capacitance (Cm) is formed, but the plurality of dummy receiving electrodes DRx0 and DRx1 are relatively spaced apart from the plurality of driving electrodes Tx0, Tx1, Tx2, and Tx3, so that the mutual capacitance (Cm) is formed small which is negligible.

FIG. 23 is another conceptual diagram in which the touch sensor according to the exemplary embodiment of the present invention having the bridge structure is conceptualized.

Referring to FIG. 23, the touch sensor according to the exemplary embodiment of the present invention includes the plurality of driving electrodes TX0 to TX3 and the plurality of receiving electrodes RX0 to RX7. Further, the touch sensor according to the exemplary embodiment of the present invention includes the plurality of dummy driving electrodes DTx0 to DTx3.

Mutual capacitance (Cm) is formed between the plurality of driving electrodes TX0 to TX3 and the plurality of receiving electrodes RX0 to RX7, but mutual capacitance (Cm) is not formed between the plurality of dummy driving electrodes DTX0 to DTX3 and the plurality of receiving electrodes Rx0 to Rx7. Herein, actually, mutual capacitance may be marginally formed between the plurality of dummy driving electrodes DTX0 to DTX3 and the plurality of receiving electrodes Rx0 to Rx7, but the marginal mutual capacitance is ignorable when the touch is detected.

The touch input device according to the exemplary embodiment of the present invention including the touch sensor may remove the noise information, particularly, the information on the amount of negative (−) capacitance changed by the LGM jamming signal by subtracting a detection signal output from the receiving electrode Rx of each of the nodes that do not form mutual capacitance (Cm) from a detection signal output from the receiving electrode Rx of each of the nodes that form mutual capacitance (Cm). Herein, the touch input device according to the exemplary embodiment of the present invention may subtract a value obtained by multiplying a detection signal output from the receiving electrode Rx of each of the nodes that do not form mutual capacitance (Cm) and a predetermined factor from a detection signal output from the receiving electrode Rx of each of the nodes that form mutual capacitance (Cm).

FIG. 24 is a configuration diagram of a touch sensor according to an example to which the conceptual diagram of the touch sensor illustrated in FIG. 23 is applicable.

Referring to FIG. 24, the plurality of receiving electrodes Rx0, Rx1, Rx2, and Rx3 is arranged in parallel in the horizontal direction, and the plurality of driving electrodes Tx0 and Tx1 is arranged in parallel in the vertical direction.

Each of the plurality of receiving electrodes Rx0, Rx1, Rx2, and Rx3 and the plurality of driving electrodes Tx0 and Tx1 has a diamond shape, and the two adjacent driving electrodes and the two adjacent receiving electrodes are electrically connected with each other through a conductive connection part.

The plurality of receiving electrodes Rx0, Rx1, Rx2, and Rx3 and the plurality of driving electrodes Tx0 and Tx1 may be implemented with a metal mesh. Herein, the conductive connection unit connecting the plurality of receiving electrodes Rx0, Rx1, Rx2, and Rx3 may also be implemented with a metal mesh. The conductive connection unit connecting the plurality of receiving electrodes Rx0, Rx1, Rx2, and Rx3 may also be implemented with a metal mesh, and may also be implemented in a conductive trace.

Each of the plurality of receiving electrodes Rx0, Rx1, Rx2, and Rx3 and the plurality of driving electrodes Tx0 and Tx1 has an electrically insulated dummy pattern inside thereof. The dummy pattern may be formed in order to reduce base capacitance of each receiving electrode and driving electrode. After the pattern of each driving electrode and the pattern of each receiving electrode are formed in the metal mesh, the dummy pattern may be formed by cutting a part of the metal mesh in each pattern.

In the plurality of dummy driving electrodes DTx0 and DTx1, the dummy patterns inside the plurality of driving electrodes Tx0 and Tx1 may be electrically connected. Since the plurality of driving electrodes Tx0 and Tx1 are very adjacent to the plurality of receiving electrodes Rx0, Rx1, Rx2, and Rx3, the mutual capacitance (Cm) is formed, but the plurality of dummy driving electrodes DTx0 and DTx1 are relatively spaced apart from the plurality of driving electrodes Tx0, Tx1, Tx2, and Tx3, so that the mutual capacitance (Cm) is formed small which is negligible.

FIG. 25 is a configuration diagram of a touch sensor according to another example to which the conceptual diagram of the touch sensor illustrated in FIG. 21 is applicable.

Referring to FIG. 25, the plurality of receiving electrodes Rx0, Rx1, and Rx2 is arranged in parallel in the horizontal direction, and the plurality of driving electrodes Tx0, Tx1, and TX2 is arranged in parallel in the vertical direction. Herein, the horizontal direction and the vertical direction may be changed.

Each of the plurality of receiving electrodes Rx0, Rx1, and Rx2 and the plurality of driving electrodes Tx0, Tx1, and Tx2 has a bar shape.

The plurality of receiving electrodes Rx0, Rx1, and Rx2 is formed on a first layer, and the plurality of driving electrodes Tx0, Tx1, and Tx2 is formed on a second layer. The first layer and the second layer are not disposed on the same plane. For example, the first layer may be disposed on the second layer. An insulating layer may be disposed between the first layer and the second layer.

The plurality of receiving electrodes Rx0, Rx1, and Rx2 and the plurality of driving electrodes Tx0, Tx1, and Tx2 may be implemented with a metal mesh or a conductive metal.

The touch sensor illustrated in FIG. 25 includes the plurality of dummy receiving electrodes DRx0, DRx1, and DRx2. The plurality of dummy receiving electrodes DRx0, DRx1, and DRx2 may be formed together on the layer on which the plurality of receiving electrodes Rx0, Rx1, and Rx2 are formed, and one dummy receiving electrode DRx0, DRx1, and DRx2 may be disposed between the plurality of receiving electrodes Rx0, Rx1, and Rx2.

Each of the driving electrodes Tx0, Tx1, and Tx2 includes a first area overlapping each of the receiving electrodes Rx0, Rx1, and Rx2 and a second area overlapping each of the dummy receiving electrodes DRx0, DRx1, and DRx2. Herein, an area of the first area is larger than an area of the second area. Particularly, the area of the second area is preferably formed as small as possible. This is for the purpose of reducing mutual capacitance between the dummy receiving electrode and the driving electrode as much as possible. Otherwise, under the condition in which the receiving electrode and the dummy receiving electrode have the same shape, a width of the first area overlapping the receiving electrode in each driving electrode may also be designed to be larger than a width of the second area overlapping the dummy receiving electrode.

Since the plurality of driving electrodes Tx0, Tx1, and Tx2 have a relatively large area overlapping the plurality of receiving electrodes Rx0, Rx1, and Rx2, relatively large mutual capacitance (Cm) is formed, but the plurality of dummy receiving electrodes DRx0, DRx1, DRx2 relatively little overlaps the plurality of driving electrodes Tx0, Tx1, and Tx2, so that the mutual capacitance (Cm) between the dummy receiving electrode and the driving electrode is formed to be small which is negligible.

FIG. 26 is a configuration diagram of a touch sensor according to another example to which the conceptual diagram of the touch sensor illustrated in FIG. 23 is applicable.

Referring to FIG. 26, the plurality of receiving electrodes Rx0, Rx1, and Rx2 is arranged in parallel in the vertical direction, and the plurality of driving electrodes Tx0, Tx1, and TX2 is arranged in parallel in the horizontal direction. Herein, the horizontal direction and the vertical direction may be changed.

Each of the plurality of receiving electrodes Rx0, Rx1, and Rx2 and the plurality of driving electrodes Tx0, Tx1, and Tx2 has a bar shape.

The plurality of receiving electrodes Rx0, Rx1, and Rx2 is formed on a first layer, and the plurality of driving electrodes Tx0, Tx1, and Tx2 is formed on a second layer. The first layer and the second layer are not disposed on the same plane. For example, the first layer may be disposed on the second layer. An insulating layer may be disposed between the first layer and the second layer.

The plurality of receiving electrodes Rx0, Rx1, and Rx2 and the plurality of driving electrodes Tx0, Tx1, and Tx2 may be implemented with a metal mesh or a conductive metal.

The touch sensor illustrated in FIG. 26 includes the plurality of dummy driving electrodes DTx0, DTx1, and DTx2. The plurality of dummy driving electrodes DTx0, DTx1, and DTx2 may be formed together on the layer on which the plurality of driving electrodes Tx0, Tx1, and Tx2 are formed, and one dummy driving electrode DTx0, DTx1, and DTx2 may be disposed between the plurality of driving electrodes Tx0, Tx1, and Tx2.

Each of the receiving electrodes Rx0, Rx1, and Rx2 includes a first area overlapping each of the driving electrodes Tx0, Tx1, and Tx2 and a second area overlapping each of the dummy driving electrodes DTx0, DTx1, and DTx2. Herein, an area of the first area is larger than an area of the second area. Particularly, the area of the second area is preferably formed as small as possible. This is for the purpose of reducing mutual capacitance between the dummy driving electrode and the receiving electrode as much as possible. Otherwise, under the condition in which the receiving electrodes have the same shape, a width of the first area in which the driving electrode overlaps the receiving electrode may also be designed to be larger than a width of the second area in which the dummy driving electrode overlaps the receiving electrode.

Since each of the plurality of driving electrodes Tx0, Tx1, and Tx2 has a relatively large area overlapping each of the plurality of receiving electrodes Rx0, Rx1, and Rx2, relatively large mutual capacitance (Cm) is formed, but each of the plurality of dummy driving electrodes DTx0, DTx1, and DTx2 relatively little overlaps each of the plurality of receiving electrodes Rx0, Rx1, and Rx2, so that the mutual capacitance (Cm) between the dummy driving electrode and the receiving electrode is formed to be small which is negligible.

Figure 27:
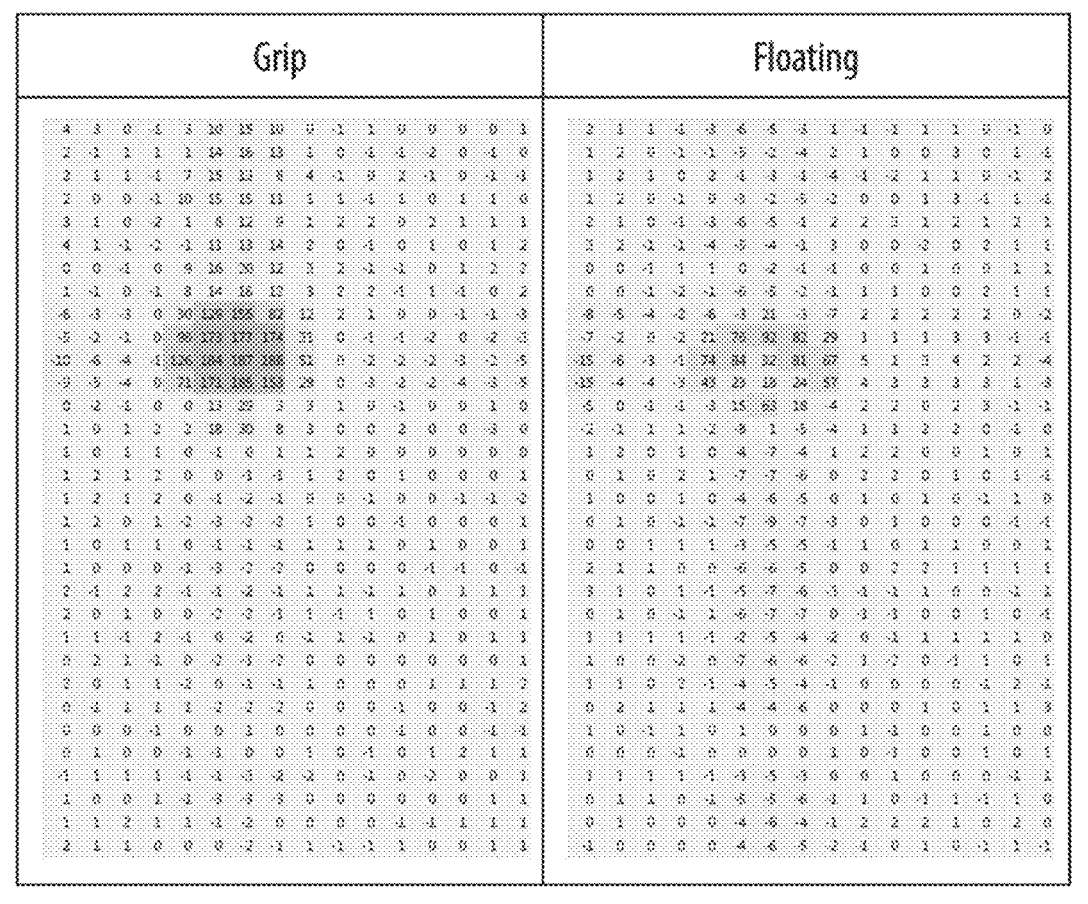

When the present applicant performed the test using a conductive rod having a diameter of 15 phi in the state where the touch input device including the touch sensor illustrated in FIG. 10 is in the grip state and the state where the touch input device including the touch sensor illustrated in FIG. 10 is in the floating state, the present applicant could obtain raw data in each state. The obtained raw data is illustrated in FIG. 27, and the left raw data of FIG. 27 is the raw data in the grip state, and the right raw data of FIG. 27 is the raw data in the floating state. When the left and right raw data of FIG. 27 are compared, it can be seen that the level values of the touch area are remarkably decreased by the LGM jamming signal generated in the floating state.

Figure 28:
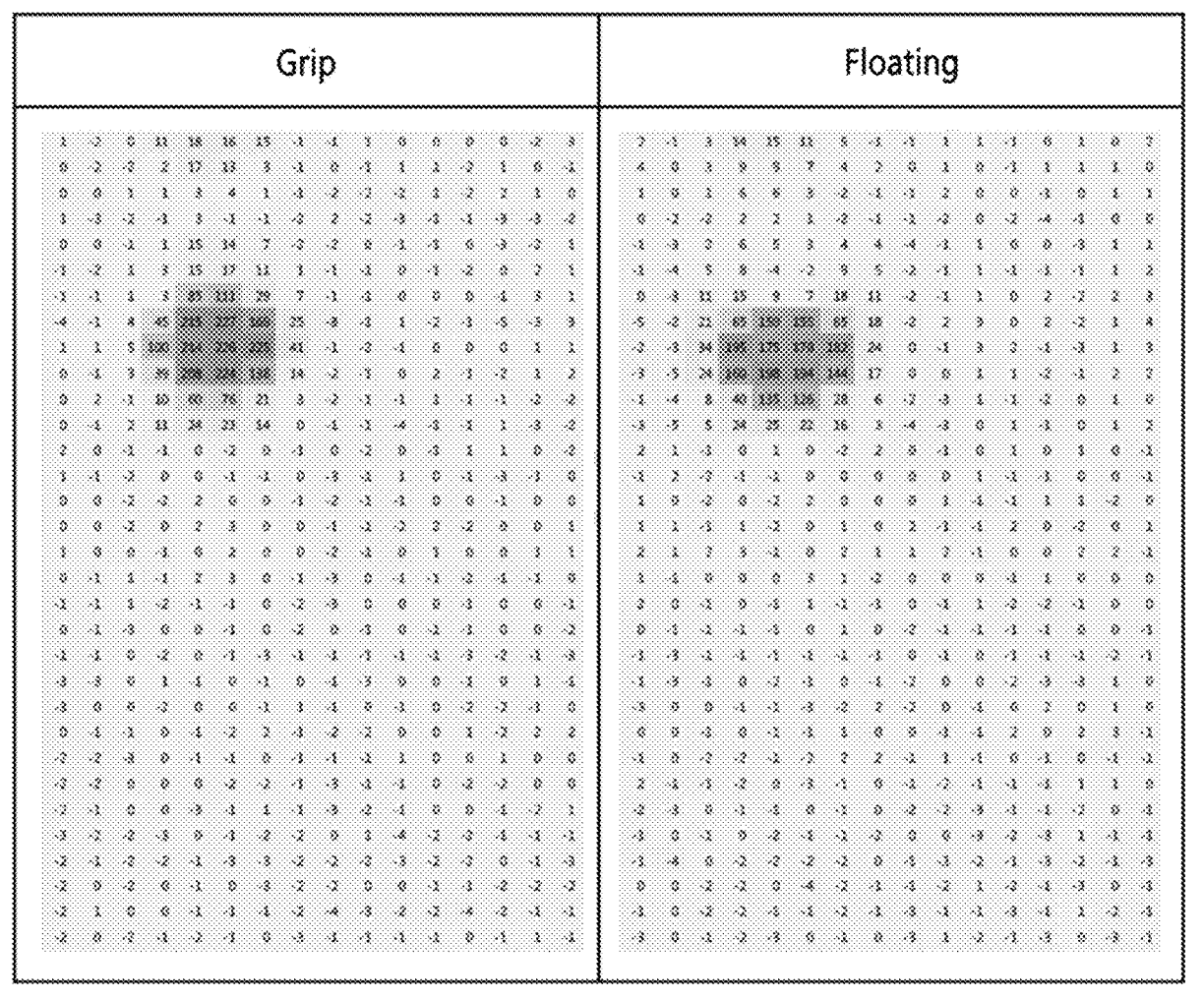

Further, the present applicant performed the test using the conductive rod having a diameter of 15 phi in the state where the touch input device including the touch sensor illustrated in FIG. 12 is in the grip state and the state where the touch input device including the touch sensor illustrated in FIG. 12 is in the floating state, and as described with reference to FIGS. 20A-C, the raw data of each state could be obtained by subtracting the detection signal output from the receiving electrode that does not form mutual capacitance with the driving electrode from the detection signal output from the receiving electrode that forms mutual capacitance with the driving electrode. The obtained raw data is illustrated in FIG. 28, and the left raw data of FIG. 28 is the raw data in the grip state, and the right raw data of FIG. 28 is the raw data in the floating state. When the left and right raw data of FIG. 28 is compared, it can be seen that the deviation of the level values within the touch area in the grip state and the floating state is considerably low compared to FIG. 27.

Figure 29:
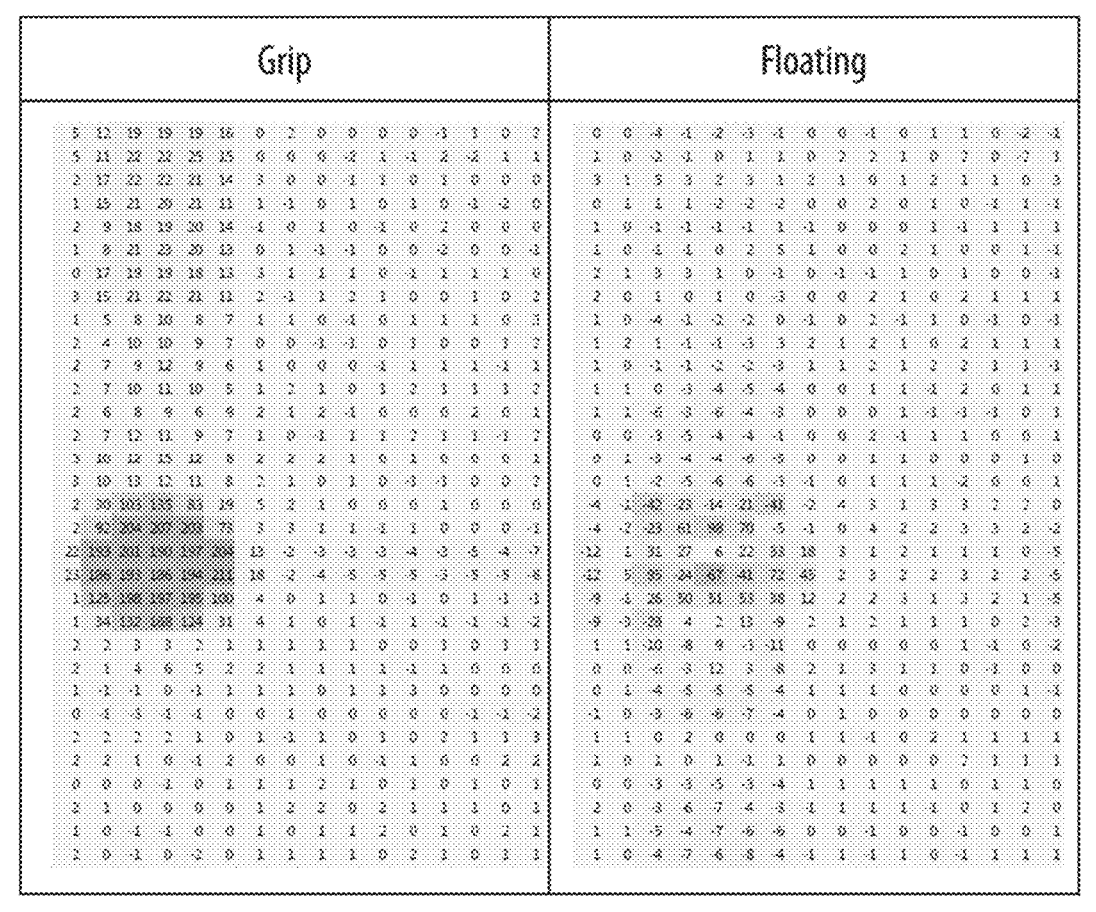

Further, when the present applicant performed the test using a conductive rod having a diameter of 20 phi in the state where the touch input device including the touch sensor illustrated in FIG. 10 is in the grip state and the state where the touch input device including the touch sensor illustrated in FIG. 10 is in the floating state, the present applicant could obtain raw data in each state. The obtained raw data is illustrated in FIG. 29, and the left raw data of FIG. 29 is the raw data in the grip state, and the right raw data of FIG. 29 is the raw data in the floating state. When the left and right raw data of FIG. 29 is compared, it can be seen that the level values of the touch area are remarkably decreased by the LGM jamming signal generated in the floating state.

Figure 30:
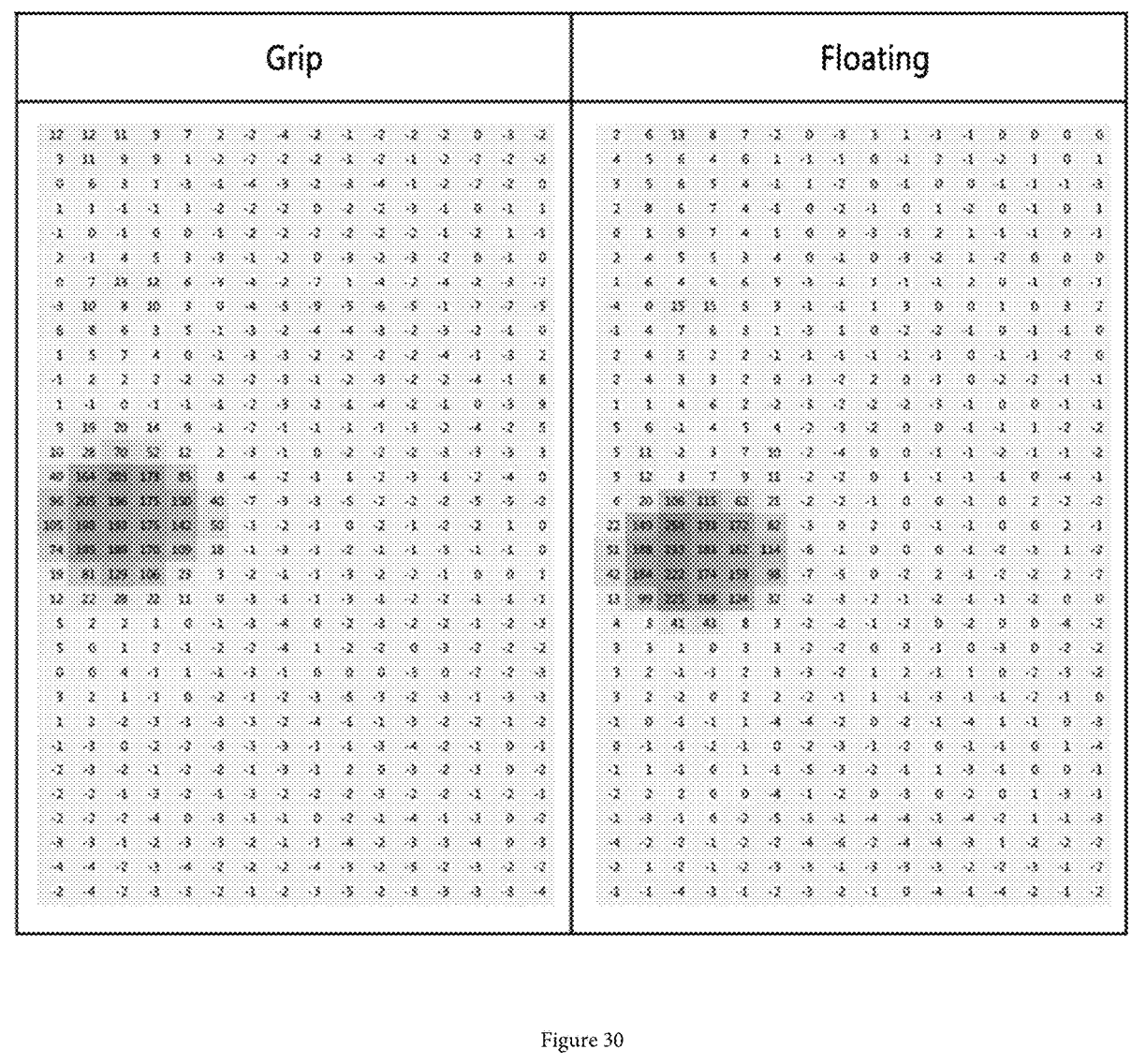

Further, the present applicant performed the test using the conductive rod having a diameter of 15 phi in the state where the touch input device including the touch sensor illustrated in FIG. 12 is in the grip state and the state where the touch input device including the touch sensor illustrated in FIG. 12 is in the floating state, and as described with reference to FIGS. 20A-C, the raw data of each state could be obtained by subtracting the detection signal output from the receiving electrode that does not form mutual capacitance with the driving electrode from the detection signal output from the receiving electrode that forms mutual capacitance with the driving electrode. The obtained raw data is illustrated in FIG. 30, and the left raw data of FIG. 30 is the raw data in the grip state, and the right raw data of FIG. 30 is the raw data in the floating state. When the left and right raw data of FIG. 30 is compared, it can be seen that the deviation of the level values within the touch area is small in the grip state and the floating state, and there is even a part where the level value in the floating state is larger.

Figure 31:
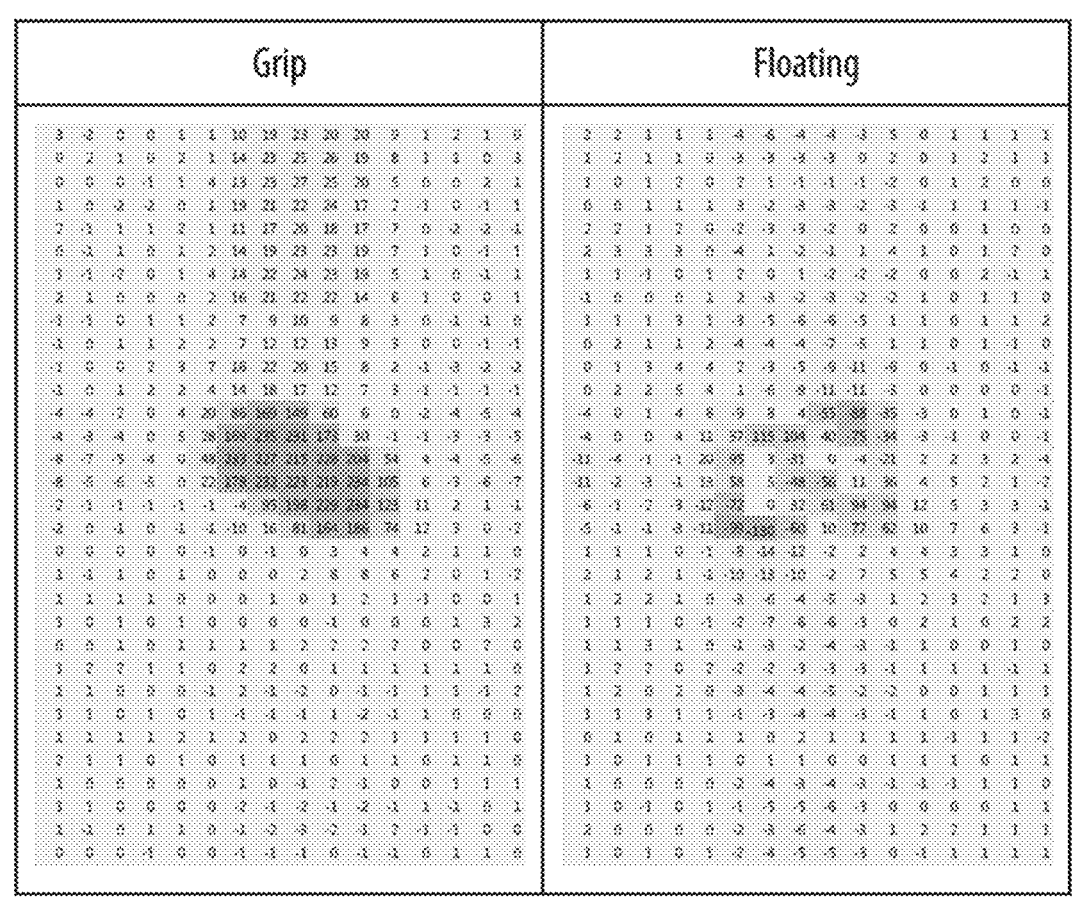

Furthermore, when the applicant performed the test using a thumb of an actual person in the state where the touch input device including the touch sensor illustrated in FIG. 10 is in the grip state and the state where the touch input device including the touch sensor illustrated in FIG. 10 is in the floating state, the applicant could obtain raw data in each state. The obtained raw data is illustrated in FIG. 31, and the left raw data of FIG. 31 is the raw data in the grip state, and the right raw data of FIG. 31 is the raw data in the floating state. When the left and right raw data of FIG. 31 is compared, it can be seen that the level values of the touch area are remarkably decreased by the LGM jamming signal generated in the floating state.

Figure 32:
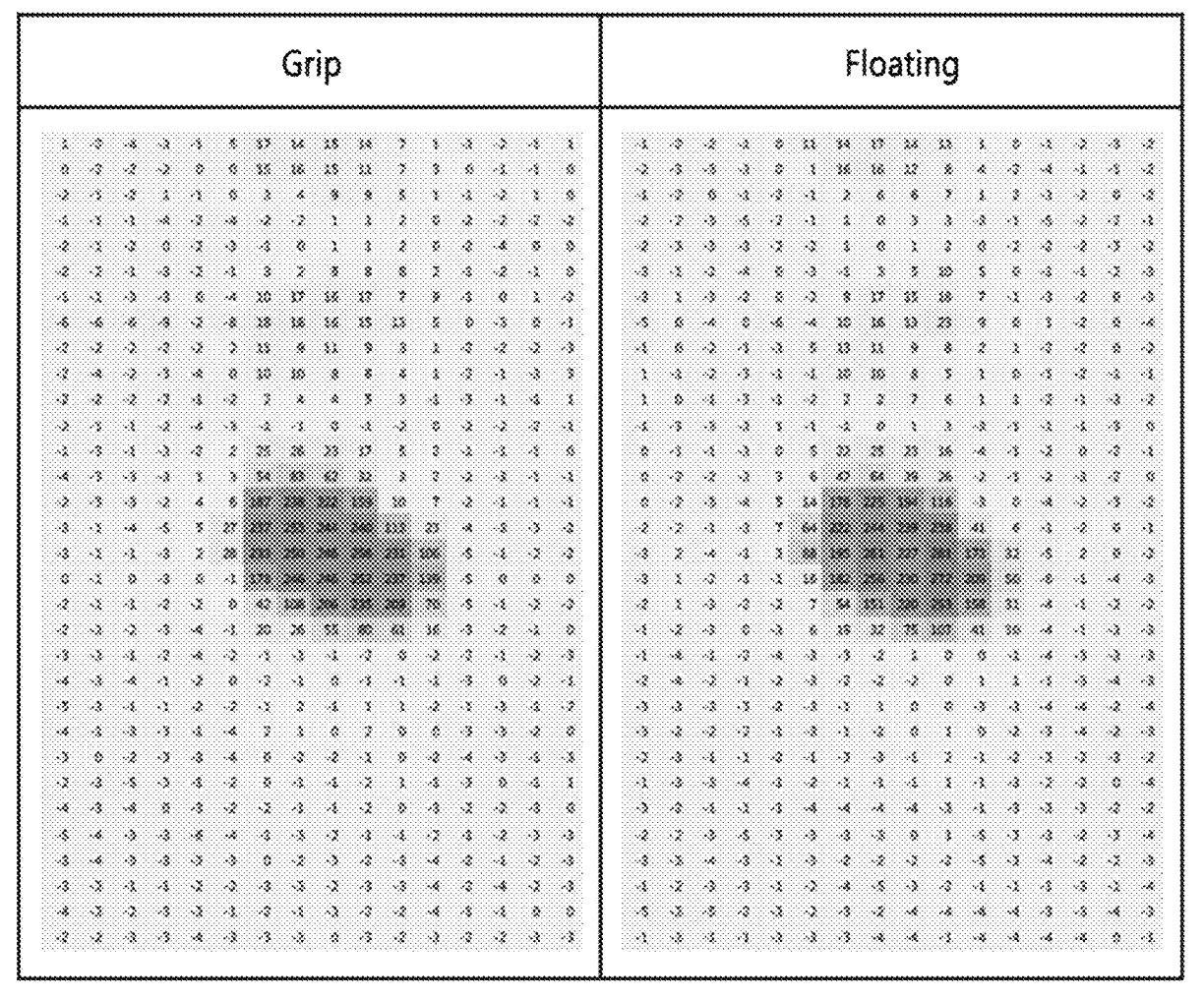

Further, the present applicant performed the test using the conductive rod having a diameter of 15 phi in the state where the touch input device including the touch sensor illustrated in FIG. 12 is in the grip state and the state where the touch input device including the touch sensor illustrated in FIG. 12 is in the floating state, and as described with reference to FIGS. 20A-C, the raw data of each state could be obtained by subtracting the detection signal output from the receiving electrode that does not form mutual capacitance with the driving electrode from the detection signal output from the receiving electrode that forms mutual capacitance with the driving electrode. The obtained raw data is illustrated in FIG. 32, and the left raw data of FIG. 32 is the raw data in the grip state, and the right raw data of FIG. 32 is the raw data in the floating state. When the left and right raw data of FIG. 32 is compared, it can be seen that there is almost no deviation between the level values within the touch area in the grip state and the floating state.

The touch input device including the touch sensor according to the exemplary embodiment of the present invention has a unique advantage in that it is possible to discriminate two or more multi-touches even in the floating state.

Figure 33:
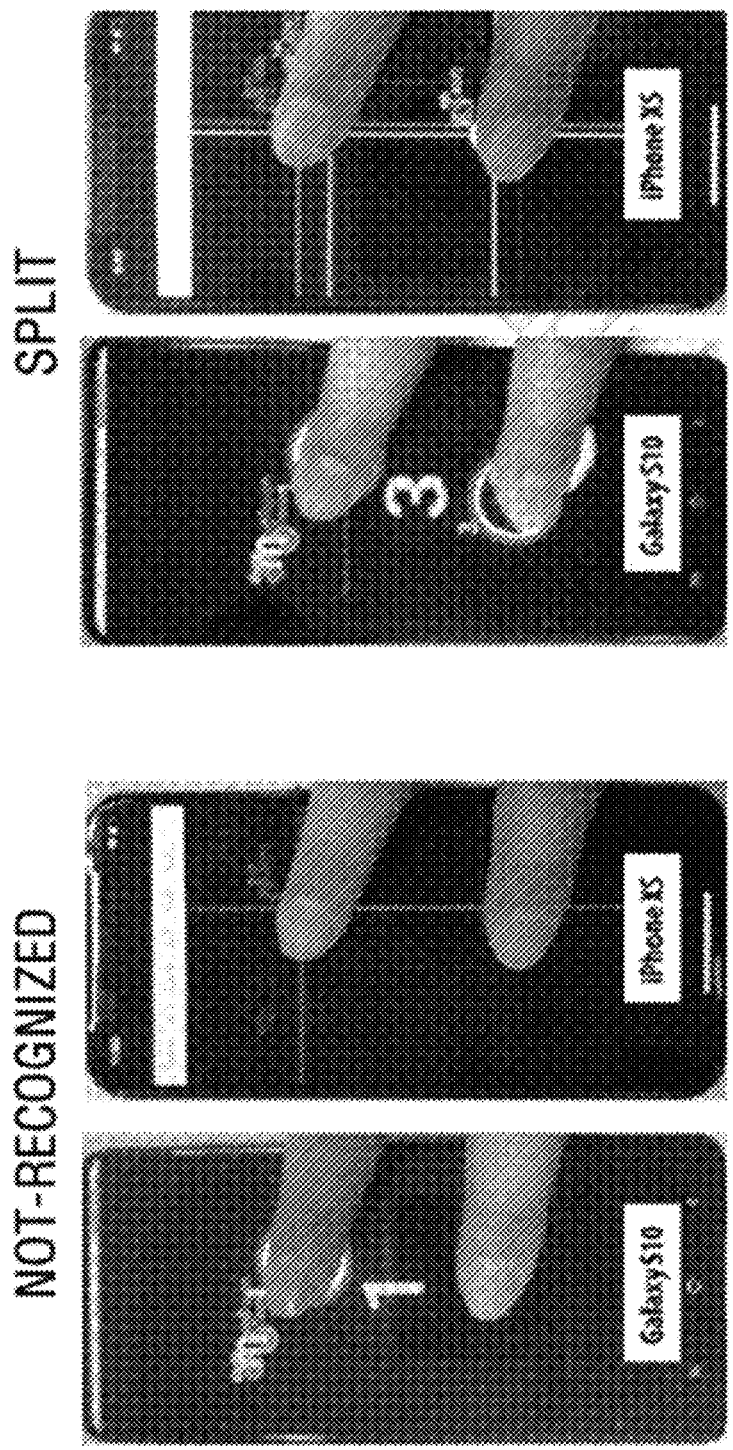
FIG. 33 is a diagram illustrating the case where the touch input devices in the related art cannot recognize multi-touches by multiple objects when the touch input devices in the related art are in the floating state.

FIG. 33 is a diagram illustrating the case where the touch input devices in the related art cannot recognize multi-touches by multiple objects when the touch input devices in the related art are in the floating state.

The situation of FIG. 33 may be, for example, the case where a user touches a touch surface of a touch input device with two fingers in the state where the touch input device in the related art is mounted on a cradle in a vehicle.

As illustrated in the left drawing of FIG. 33, the touch input devices in the related art do not recognize one touch between two multi-touches, or as illustrated in the right drawing of FIG. 33, the user inputs two touches, but the touch input device recognizes the two touches as three or four multi-touches.

Figures 34A, 34B, 34C:
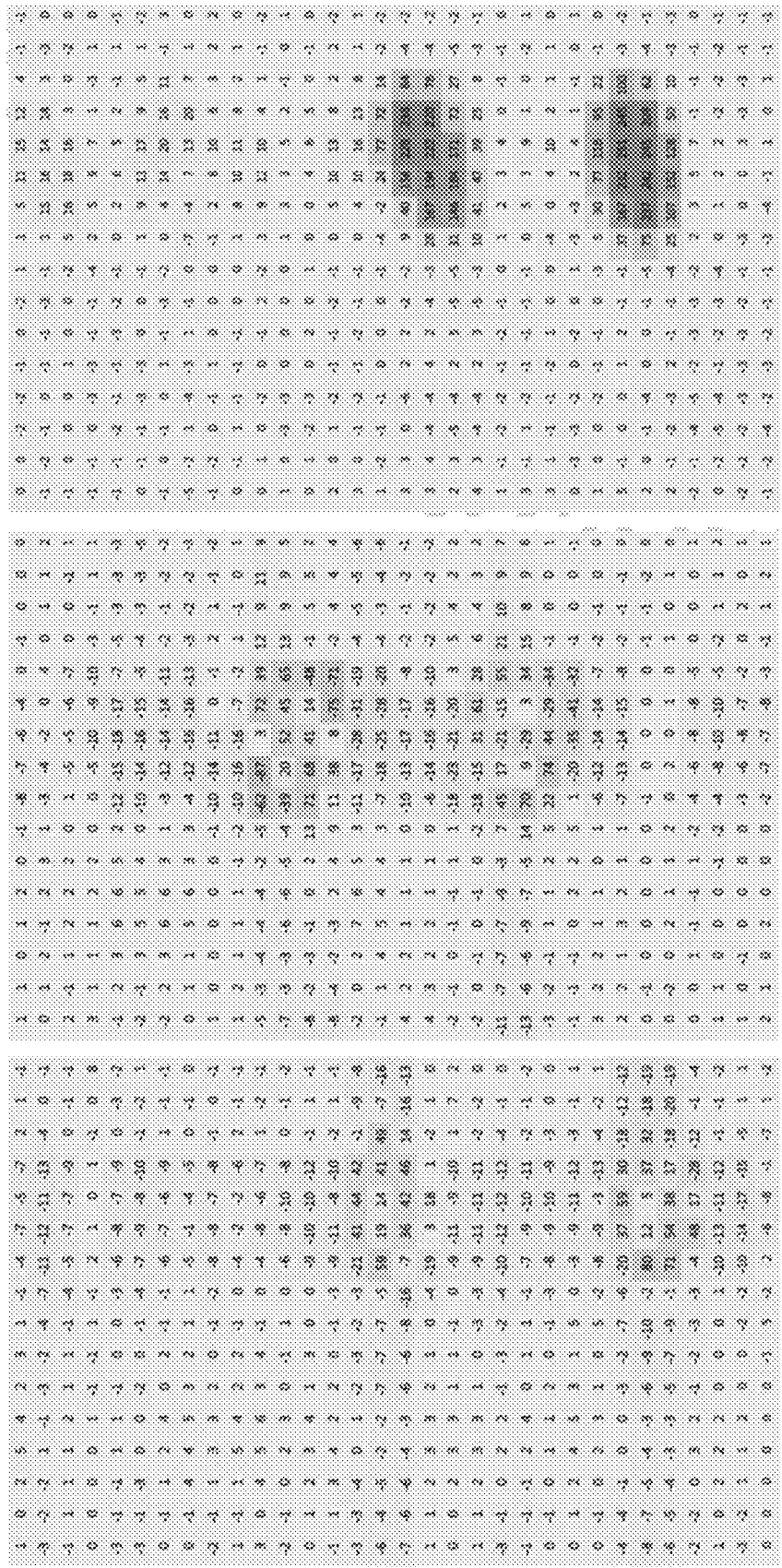
FIGS. 34A-C are raw data for describing that the touch input device according to the exemplary embodiment of the present invention recognizes multi-touches.

FIG. 34A represents the raw data when a multi-touch is performed after the touch input device including the touch sensor of the dual layers illustrated in FIG. 3 is placed in the floating state. Referring to FIG. 34A, the level values of the regions multi-touched are relatively low by the LGM jamming signal generated in the floating state. When a reference level value for determining whether a touch is input is set to 65, a portion touched relatively above is not recognized as a touch, and only a portion touched relatively below may be recognized as a touch, so that there occurs a phenomenon in which one of the two touches is not recognized.

FIG. 34B represents the raw data when a multi-touch is performed after the touch input device including the touch sensor illustrated in FIG. 10 is placed in the floating state. Referring to FIG. 34B, there is a portion in which the level values of the regions multi-touched are relatively low by the LGM jamming signal generated in the floating state. When a reference level value for determining whether a touch is input is set to 65, three or more touches may be recognized as present.

FIG. 34C represents the raw data in the case where a multi-touch is performed after the touch input device is placed in the floating state when the method of subtracting the detection signal output from the receiving electrode that does not form mutual capacitance with the driving electrode from the detection signal output from the receiving electrode that forms mutual capacitance with the driving electrode is applied to the touch input device including the touch sensor illustrated in FIG. 12 as described with reference to FIGS. 20A-C. Referring to FIG. 34C, since the relatively large positive level values are output from the multi-touched two parts, the touch input device may accurately recognize the multi-touch of the user as the multi-touch.

Further, the touch input device including the touch sensor according to the exemplary embodiment of the present invention has a unique advantage in that it is possible to discriminate a third touch touched together with a cross touch.

FIG. 35 is a diagram illustrating the case where a third touch is not recognized when a cross touch and the third touch are input together to touch surfaces of the touch input devices in the related art.

The touch input devices in the related art could not recognize a third touch among two cross touches by two fingers of the left hand and the third touch by one finger of the right hand as illustrated in the left and right drawings of FIG. 35.

Figures 36A, 36B, 36C:
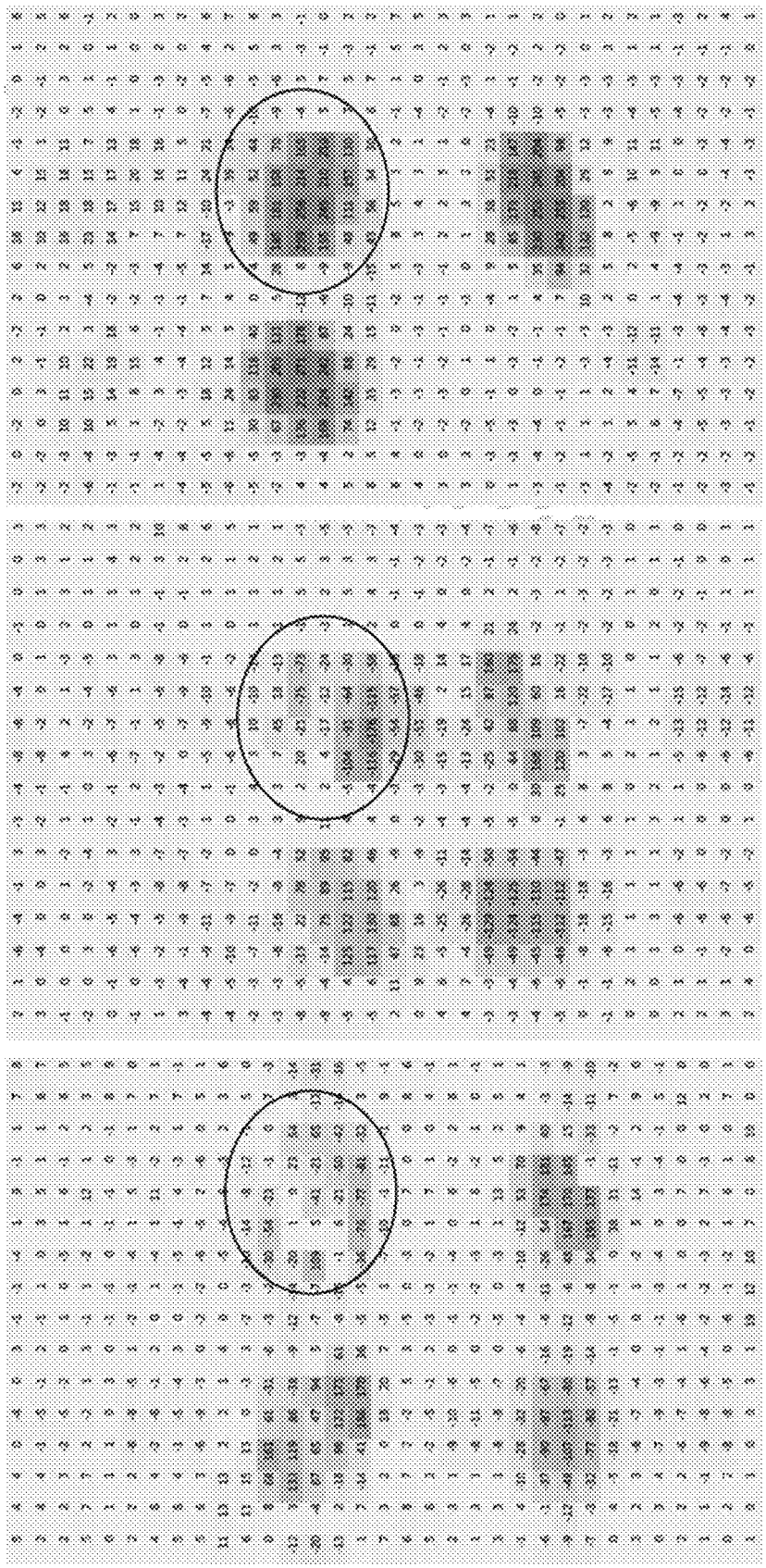
FIGS. 36A-C are raw data for describing that the touch input device according to the exemplary embodiment of the present invention recognizes a cross touch and a third touch.

FIG. 36A is the raw data when a cross touch and a third touch are input to the touch input device including the touch sensor of the dual layers illustrated in FIG. 3. Referring to FIG. 36A, a level value in a circle region corresponding to the third touch is relatively low compared to the cross touched portions. Accordingly, the touch input device does not recognize the third touch.

FIG. 36B represents the raw data when a cross touch and the third touch are input to the touch input device including the touch sensor illustrated in FIG. 10. Referring to FIG. 36B, a level value in a circle region corresponding to the third touch is relatively low compared to the cross touched portions. Accordingly, the touch input device does not recognize the third touch.

FIG. 36C represents the raw data in the case where a cross touch and a third touch are input to the touch input device when the method of subtracting the detection signal output from the receiving electrode that does not form mutual capacitance with the driving electrode from the detection signal output from the receiving electrode that forms mutual capacitance with the driving electrode is applied to the touch input device including the touch sensor illustrated in FIG. 12 as described with reference to FIGS. 20A-C. Referring to FIG. 36C, it can be seen that the relatively large positive (+) level values are output from the cross-touched two parts, and the relatively large positive (+) level values are output from a circle region corresponding to the third touch. That is, the touch input device may recognize both the cross touch and the third touch together.

The aforementioned characteristic, structure, effect, and the like described in the exemplary embodiments are included in one exemplary embodiment of the present invention, and are not essentially limited to only one exemplary embodiment. Further, the characteristic, structure, effect, and the like described in each exemplary embodiment may be carried out in other exemplary embodiments through combination or modification by those skilled in the art to which the exemplary embodiments pertain. Accordingly, it shall be construed that contents relating to the combination and the modification are included in the scope of the present invention.

In addition, although the exemplary embodiments have been described above, these are only examples, and do not limit the present invention, and those skilled in the art will know that various modifications and applications which are not exemplified above are possible within the scope without departing from the essential characteristics of the present exemplary embodiment. For example, each component specifically presented in the exemplary embodiment may be modified and implemented. Further, it should be interpreted that the differences in relation to the modification and the application are included in the scope of the present invention defined in the accompanying claims.

The invention claimed is:

1. A touch input device including a touch surface, comprising:
    a display panel disposed under the touch surface;
    a touch sensor which is disposed under the touch surface and includes a plurality of driving electrodes, a plurality of receiving electrodes, and a plurality of dummy receiving electrodes; and
    a touch detection unit configured to detect a touch position of an object input to the touch surface based on a detection signal output from the plurality of receiving electrodes of the touch sensor,
    wherein the touch detection unit detects the touch position of the object input to the touch surface by subtracting a second detection signal output from a dummy receiving electrode that does not form mutual capacitance with a predetermined driving electrode among the plurality of dummy receiving electrodes from a first detection signal output from a predetermined receiving electrode that forms mutual capacitance with the predetermined driving electrode among the plurality of receiving electrodes, wherein the first detection signal includes information on an amount of mutual capacitance changed between the predetermined driving electrode and the predetermined receiving electrode and noise information, the second detection signal includes the noise information, and the noise information includes display noise information of the display panel, noise information by a conversion of an image displayed on the display panel, and information on an amount of negative (−) capacitance changed by an LGM signal generated by coupling between the object and the predetermined driving electrode, wherein when a driving signal is applied to another driving electrode different from the predetermined driving electrode, the first detection signal is output from a second receiving electrode, and the second detection signal is output from a first receiving electrode of the plurality of receiving electrodes.

2. The touch input device of claim 1, wherein the touch sensor includes a first layer on which the plurality of driving electrodes is disposed and a second layer on which the plurality of receiving electrodes is disposed, the plurality of dummy receiving electrodes is disposed on the second layer, and is disposed so as to be electrically insulated from the plurality of receiving electrodes, the driving electrode includes a first area overlapping the receiving electrode and a second area overlapping the dummy receiving electrode, and the first area is larger than the second area.

3. The touch input device of claim 1, wherein the touch detection unit detects the touch position of the object input to the touch surface by subtracting a value obtained by multiplying the second detection signal and a predetermined factor from the first detection signal.

4. A touch input device including a touch surface, comprising:

a display panel disposed under the touch surface;

a touch sensor which is disposed under the touch surface and includes a plurality of driving electrodes, a plurality of receiving electrodes, and a plurality of dummy driving electrodes; and a touch detection unit configured to detect a touch position of an object input to the touch surface based on a detection signal output from the plurality of receiving electrodes of the touch sensor, wherein the touch detection unit detects the touch position of the object input to the touch surface by subtracting a second detection signal output from a predetermined receiving electrode that does not form mutual capacitance with a predetermined dummy driving electrode among the plurality of receiving electrodes from a first detection signal output from a predetermined receiving electrode that forms mutual capacitance with a predetermined driving electrode among the plurality of receiving electrodes, wherein the first detection signal includes display noise information of the display panel, noise information by a conversion of an image displayed on the display panel, and information on an amount of mutual capacitance changed between the predetermined driving electrode and the predetermined receiving electrode and noise information, the second detection signal includes the noise information, and the noise information includes information on an amount of negative (−) capacitance changed by an LGM signal generated by coupling between the object and the predetermined driving electrode, wherein when a driving signal is applied to another driving electrode different from the predetermined driving electrode, the first detection signal is output from a second receiving electrode, and the second detection signal is output from a first receiving electrode of the plurality of receiving electrodes.

5. The touch input device of claim 4, wherein the touch sensor includes a first layer on which the plurality of driving electrodes is disposed and a second layer on which the plurality of receiving electrodes is disposed, the plurality of dummy driving electrodes is disposed on the first layer, and is disposed so as to be electrically insulated from the plurality of driving electrodes, the receiving electrode includes a first area overlapping the driving electrode and a second area overlapping the dummy driving electrode, and the first area is larger than the second area.

6. The touch input device of claim 4, wherein the touch detection unit detects the touch position of the object input to the touch surface by subtracting a value obtained by multiplying the second detection signal and a predetermined factor from the first detection signal.

7. A touch input device including a touch surface, comprising:

a display panel disposed under the touch surface;

a touch sensor which is disposed under the touch surface and includes a plurality of driving electrodes and a plurality of receiving electrodes; and a touch detection unit configured to detect a touch position of an object input to the touch surface based on a detection signal output from the plurality of receiving electrodes of the touch sensor, wherein the touch detection unit detects the touch position of the object input to the touch surface by subtracting a second detection signal output from another predetermined receiving electrode that does not form mutual capacitance with a predetermined driving electrode among the plurality of receiving electrodes from a first detection signal output from a predetermined receiving electrode that forms mutual capacitance with the predetermined driving electrode among the plurality of receiving electrodes, wherein the first detection signal includes information on an amount of mutual capacitance changed between the predetermined driving electrode and the predetermined receiving electrode and noise information, the second detection signal includes the noise information, and the noise information includes display noise information of the display panel, noise information by a conversion of an image displayed on the display panel, and information on an amount of negative (−) capacitance changed by an LGM signal generated by coupling between the object and the predetermined driving electrode, wherein when a driving signal is applied to another driving electrode different from the predetermined driving electrode, the first detection signal is output from a second receiving electrode, and the second detection signal is output from a first receiving electrode of the plurality of receiving electrodes.

8. The touch input device of claim 7, wherein the plurality of driving electrodes and the plurality of receiving electrodes are disposed on a same layer so as to be electrically insulated from each other,
and wherein one or more driving electrodes that are not electrically connected with the predetermined driving electrode are disposed between the predetermined driving electrode and the another predetermined receiving electrode.

9. The touch input device of claim 7, wherein the touch detection unit detects the touch position of the object input to the touch surface by subtracting a value obtained by multiplying the second detection signal and a predetermined factor from the first detection signal.

10. The touch input device of claim 7, further comprising:
a driving unit for applying a driving signal to the plurality of driving electrodes,
wherein when the driving signal is applied to another driving electrode different from the predetermined driving electrode by the driving unit, the predetermined receiving electrode does not form mutual capacitance with the another driving electrode, and the another predetermined receiving electrode forms mutual capacitance with the another driving electrode.

11. A touch sensor, comprising:
a plurality of driving electrodes;
a plurality of receiving electrodes which is electrically insulated from the plurality of driving electrodes, and forms mutual capacitance with the plurality of driving electrodes; and
a plurality of dummy receiving electrodes which is electrically insulated from the plurality of driving electrodes and the plurality of receiving electrodes, and does not form mutual capacitance with the plurality of driving electrodes,
wherein when a driving signal is applied through a predetermined driving electrode among the plurality of driving electrodes, a first detection signal output from a predetermined receiving electrode among the plurality of receiving electrodes includes information on an amount of mutual capacitance changed between the predetermined driving electrode and the predetermined receiving electrode and noise information,
a second detection signal output from a predetermined dummy receiving electrode among the plurality of dummy receiving electrodes includes the noise information, and
the noise information includes display noise information of a display panel, noise information by a conversion of an image displayed on the display panel, and information on an amount of negative (−) capacitance changed by an LGM signal generated by coupling between an object and the predetermined driving electrode,
wherein when the driving signal is applied to another driving electrode different from the predetermined driving electrode, the first detection signal is output from a second receiving electrode, and the second detection signal is output from a first receiving electrode of the plurality of receiving electrodes.

12. The touch sensor of claim 11, further comprising:
a first layer on which the plurality of driving electrodes is disposed and a second layer on which the plurality of receiving electrodes is disposed,
wherein the plurality of dummy receiving electrodes is disposed on the second layer,
the driving electrode includes a first area overlapping the receiving electrode and a second area overlapping the dummy receiving electrode, and
the first area is larger than the second area.

13. A touch sensor, comprising:
a plurality of driving electrodes;
a plurality of dummy driving electrodes electrically insulated from the plurality of driving electrodes; and
a plurality of receiving electrodes which is electrically insulated from the plurality of driving electrodes and the plurality of dummy driving electrodes, forms mutual capacitance with the plurality of driving electrodes, and does not form the mutual capacitance with the plurality of dummy driving electrodes,
wherein a predetermined receiving electrode among the plurality of receiving electrodes outputs a first detection signal and a second detection signal,
the first detection signal includes information on an amount of mutual capacitance changed between the predetermined receiving electrode and a predetermined driving electrode among the plurality of driving electrodes and noise information,
a second detection signal includes the noise information, and
the noise information includes display noise information of a display panel, noise information by a conversion of an image displayed on the display panel, and information on an amount of negative (−) capacitance changed by an LGM signal generated by coupling between an object and the predetermined driving electrode,
wherein when a driving signal is applied to another driving electrode different from the predetermined driving electrode, the first detection signal is output from a second receiving electrode, and the second detection signal is output from a first receiving electrode of the plurality of receiving electrodes.

14. The touch sensor of claim 13, further comprising:
a first layer on which the plurality of driving electrodes is disposed and a second layer on which the plurality of receiving electrodes is disposed,
wherein the plurality of dummy driving electrodes is disposed on the first layer,
the receiving electrode includes a first area overlapping the driving electrode and a second area overlapping the dummy driving electrode, and
the first area is larger than the second area.

15. A touch sensor, comprising:
a plurality of driving electrodes; and
a plurality of receiving electrodes which is electrically insulated from the plurality of driving electrodes,
wherein when a driving signal is applied through a predetermined driving electrode among the plurality of driving electrodes, a first detection signal output from a first receiving electrode that forms mutual capacitance with the predetermined driving electrode among the plurality of receiving electrodes includes information on an amount of mutual capacitance changed between the predetermined driving electrode and the first receiving electrode and noise information,
a second detection signal output from a second receiving electrode that does not form the mutual capacitance with the predetermined driving electrode among the plurality of receiving electrodes includes the noise information, and the noise information includes display noise information of a display panel, noise information by a conversion of an image displayed on the display panel, and information on an amount of negative (−) capacitance changed by an LGM signal generated by coupling between an object and the predetermined driving electrode, wherein when the driving signal is applied to another driving electrode different from the predetermined driving electrode, the first detection signal is output from a second receiving electrode, and the second detection signal is output from the first receiving electrode.

16. The touch sensor of claim 15, wherein the plurality of driving electrodes and the plurality of receiving electrodes are disposed on a same layer so as to be electrically insulated from each other, and wherein one or more driving electrodes that are not electrically connected with the predetermined driving electrode are disposed between the predetermined driving electrode and the second receiving electrode.

* * * * *